US006340909B1

United States Patent
Zerbe et al.

(10) Patent No.: US 6,340,909 B1
(45) Date of Patent: Jan. 22, 2002

(54) METHOD AND APPARATUS FOR PHASE INTERPOLATION

(75) Inventors: Jared L. Zerbe, Palo Alto; Grace Tsang, Los Altos; Clemenz L. Portmann, Cupertino, all of CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/572,405

(22) Filed: May 16, 2000

Related U.S. Application Data

(63) Continuation of application No. 09/016,084, filed on Jan. 30, 1998, now Pat. No. 6,111,445.

(51) Int. Cl.[7] .............................................. H03H 11/16
(52) U.S. Cl. ...................... 327/246; 327/256; 327/258
(58) Field of Search ................................ 327/231, 237, 327/246, 256–258, 403, 404

(56) References Cited

U.S. PATENT DOCUMENTS

| | | | |
|---|---|---|---|
| 4,468,689 A | | 8/1984 | Nagashima |
| 4,479,094 A | * | 10/1984 | Harris ........................ 327/333 |
| 4,658,160 A | * | 4/1987 | Young ........................ 327/53 |
| 4,959,618 A | | 9/1990 | Shier |
| 5,008,629 A | | 4/1991 | Ohba et al. |
| 5,059,992 A | | 10/1991 | Akiike |
| 5,146,121 A | | 9/1992 | Searles et al. |
| 5,179,303 A | | 1/1993 | Searles et al. |
| 5,220,206 A | | 6/1993 | Tsang et al. |
| 5,220,294 A | | 6/1993 | Ichikawa |
| 5,241,220 A | | 8/1993 | Karlock |
| 5,379,002 A | | 1/1995 | Jokura |
| 5,491,443 A | * | 2/1996 | Zarabadi ..................... 327/437 |
| 5,523,724 A | | 6/1996 | Assar et al. |
| 5,543,742 A | | 8/1996 | Takeda et al. |
| 5,554,945 A | | 9/1996 | Lee et al. |
| 5,568,073 A | * | 10/1996 | McClure ..................... 327/403 |
| 5,572,158 A | | 11/1996 | Lee et al. |
| 5,594,383 A | * | 1/1997 | Tamba ........................ 327/552 |
| 5,642,062 A | * | 6/1997 | Kawakami .................. 327/108 |
| 5,714,904 A | * | 2/1998 | Jeong ......................... 327/407 |
| 5,982,227 A | * | 11/1999 | Kim et al. ................... 327/513 |

FOREIGN PATENT DOCUMENTS

| | | |
|---|---|---|
| EP | 0 405 523 | 1/1991 |
| EP | 0 614 283 | 2/1994 |
| EP | 0 718 978 | 6/1996 |
| GB | 2 183 948 | 6/1987 |
| WO | 95/22206 | 2/1995 |
| WO | 98/43355 | 3/1998 |

OTHER PUBLICATIONS

Rezzi, et al. "A PLL–Based Frequency Synthesizer for 160–MHz Double Sampled SC Filters", IEEE Joureral of Solid–State Circuits, vol. 31, No. 10, Oct. 1996, pp. 1560–1564.

Lee et al., "A 2.5 V CMOS Delay–Locked Loop for an 18 Mbit, 500 Megabyte/s DRAM", IEEE Journal of Solid–State Circuits, vol. 29, No. 12, Dec. 1994, pp. 1491–1496.

Sidiropoulos, et al., "A Semidigital Dual Delay–Locked Loop", IEEE Journal of Solid–State Circuits, vol. 32, No. 11, Nov. 1997 pp. 1683–1692.

You, et al., "An Improved Tail Current Source for Low Voltage Applications", IEEE Journal of Solid–Stae Circuits, vol. 32, No. 8, Aug. 1997, pp. 1173–1179.

* cited by examiner

*Primary Examiner*—Kenneth B. Wells

(57) ABSTRACT

A phase interpolater circuit includes a first adjustable current supply to generate a first current that is based on the amplitude of a first controlled voltage and a first current mirror circuit to generate a second current that is based on the first current. The phase interpolater circuit further includes a first current steering switch to steer the second current to one of first and second nodes to generate a first voltage transition at one of the first and second nodes, the second current being steered to the first node when a first input signal is in a first state and to the second node when the first input signal is in a second state.

42 Claims, 29 Drawing Sheets

FIG_1
Prior Art
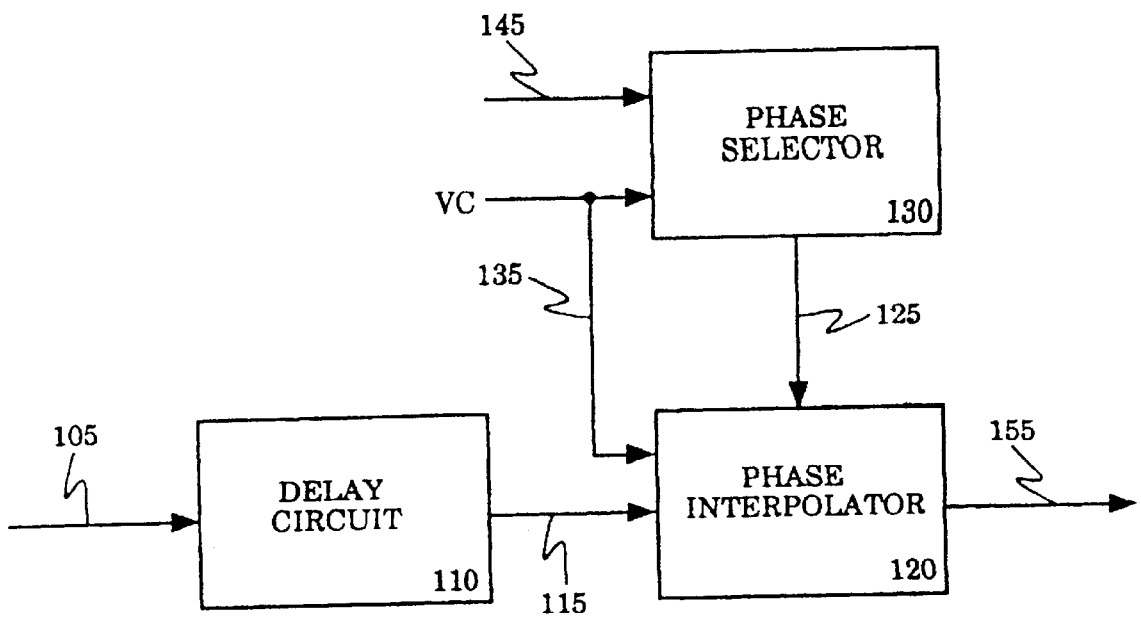

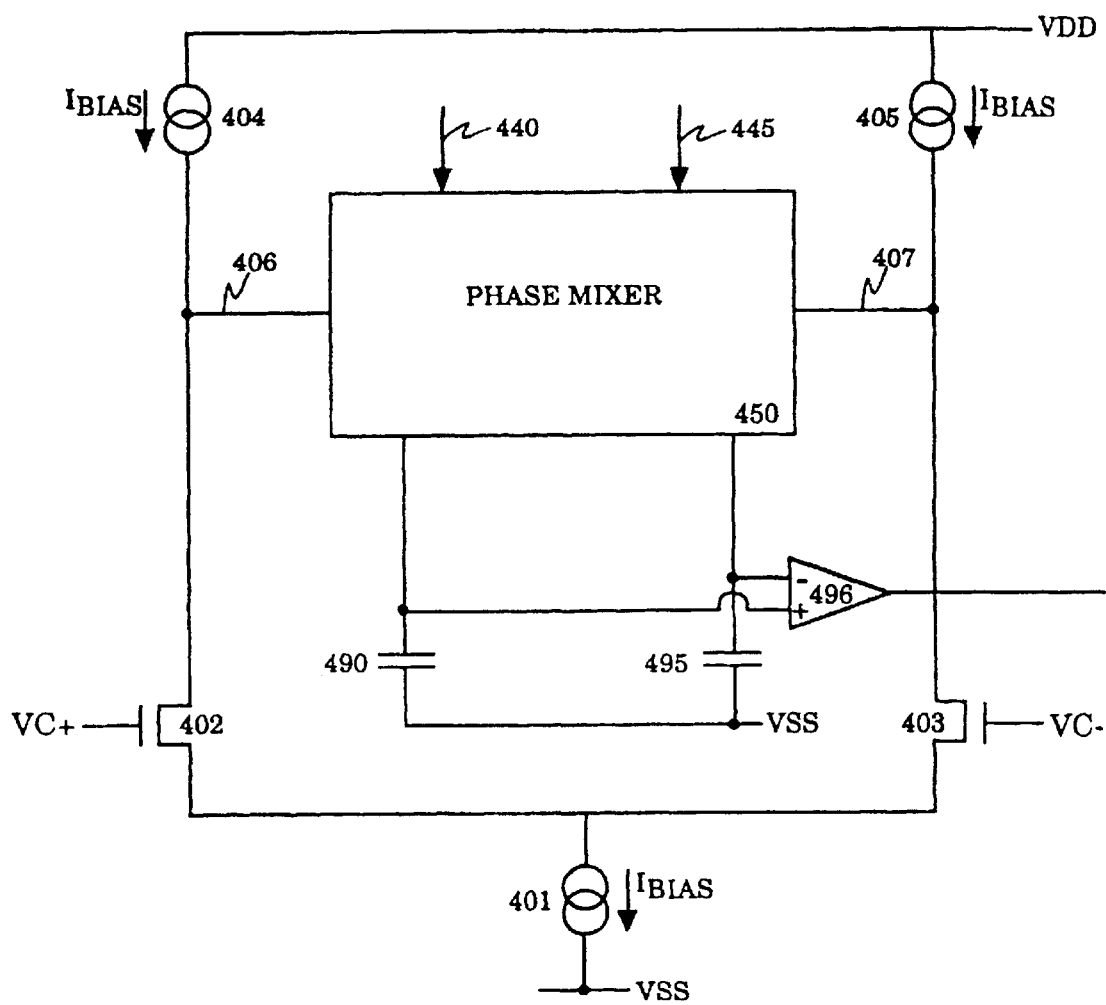
FIG_2
Prior Art

FIG_3
Prior Art
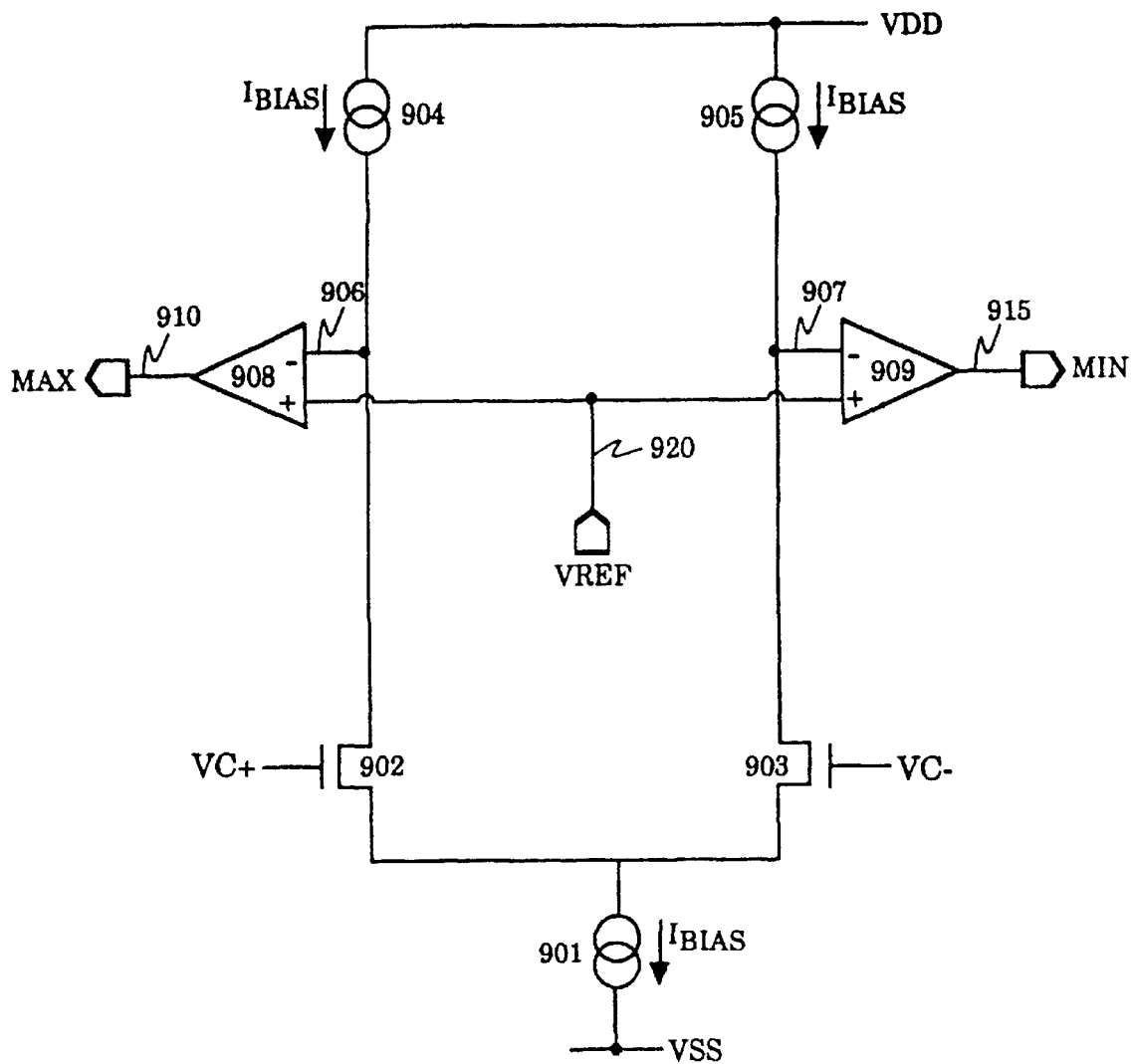

FIG_4
Prior Art
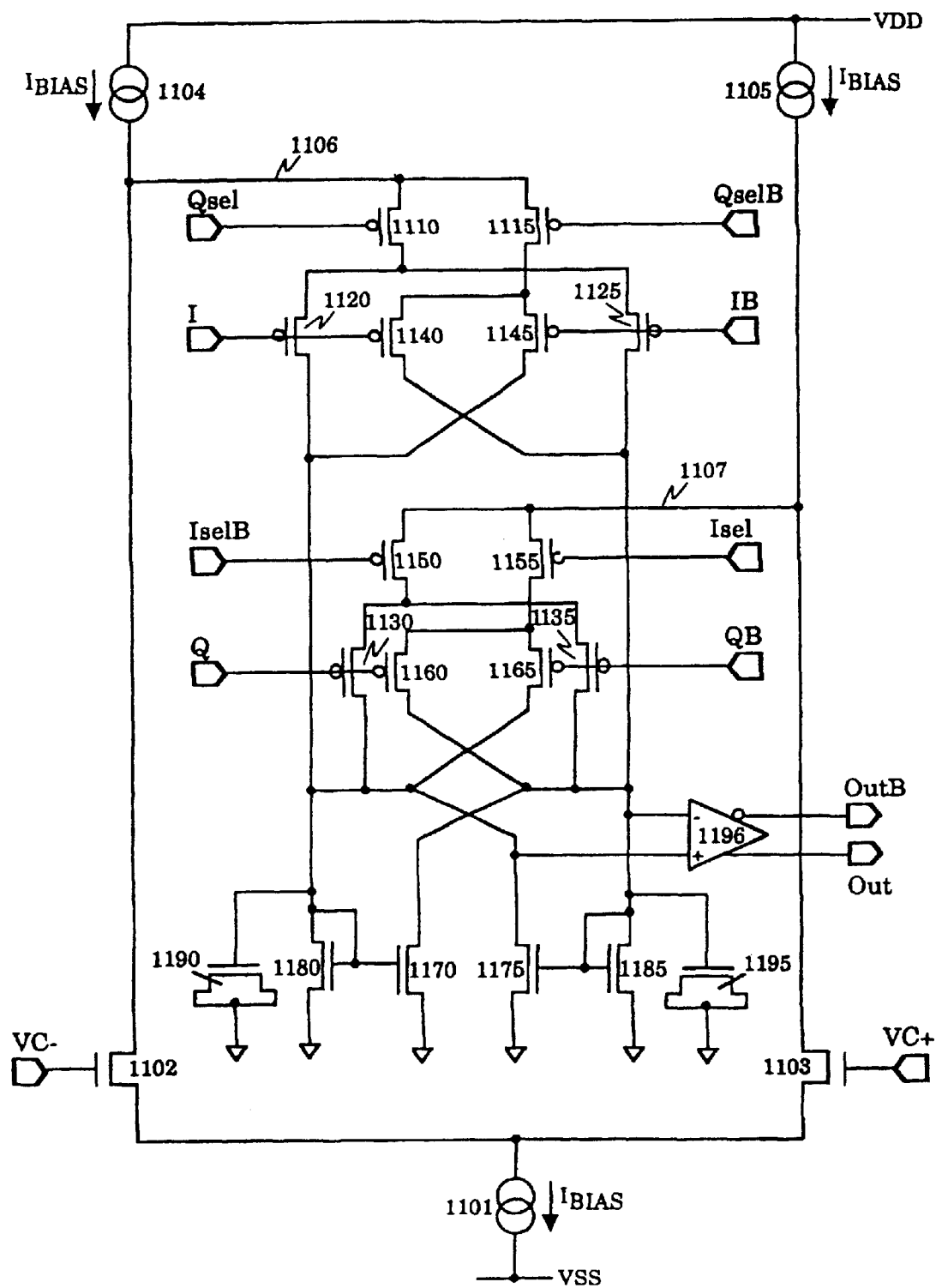

FIG_5
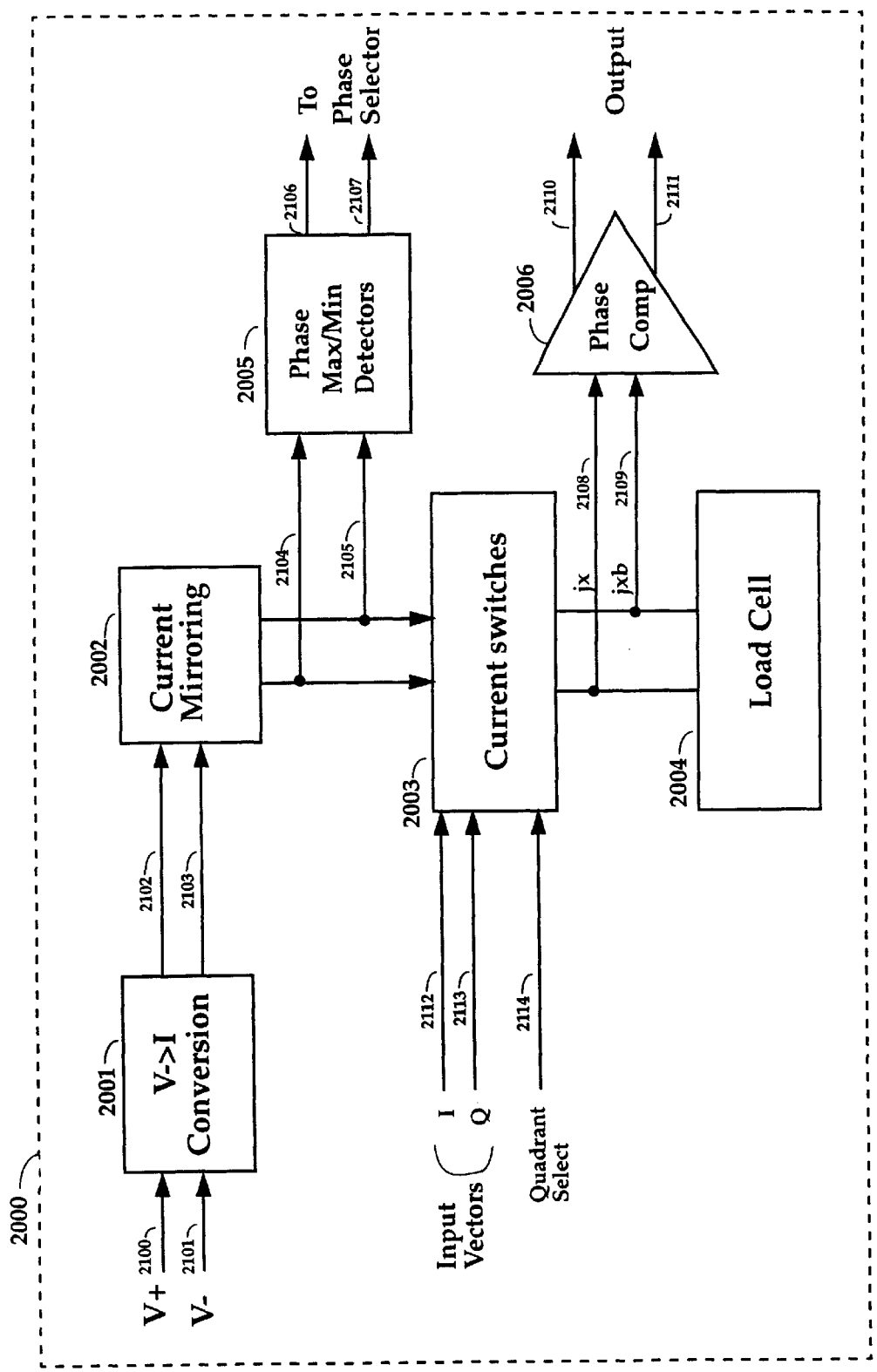

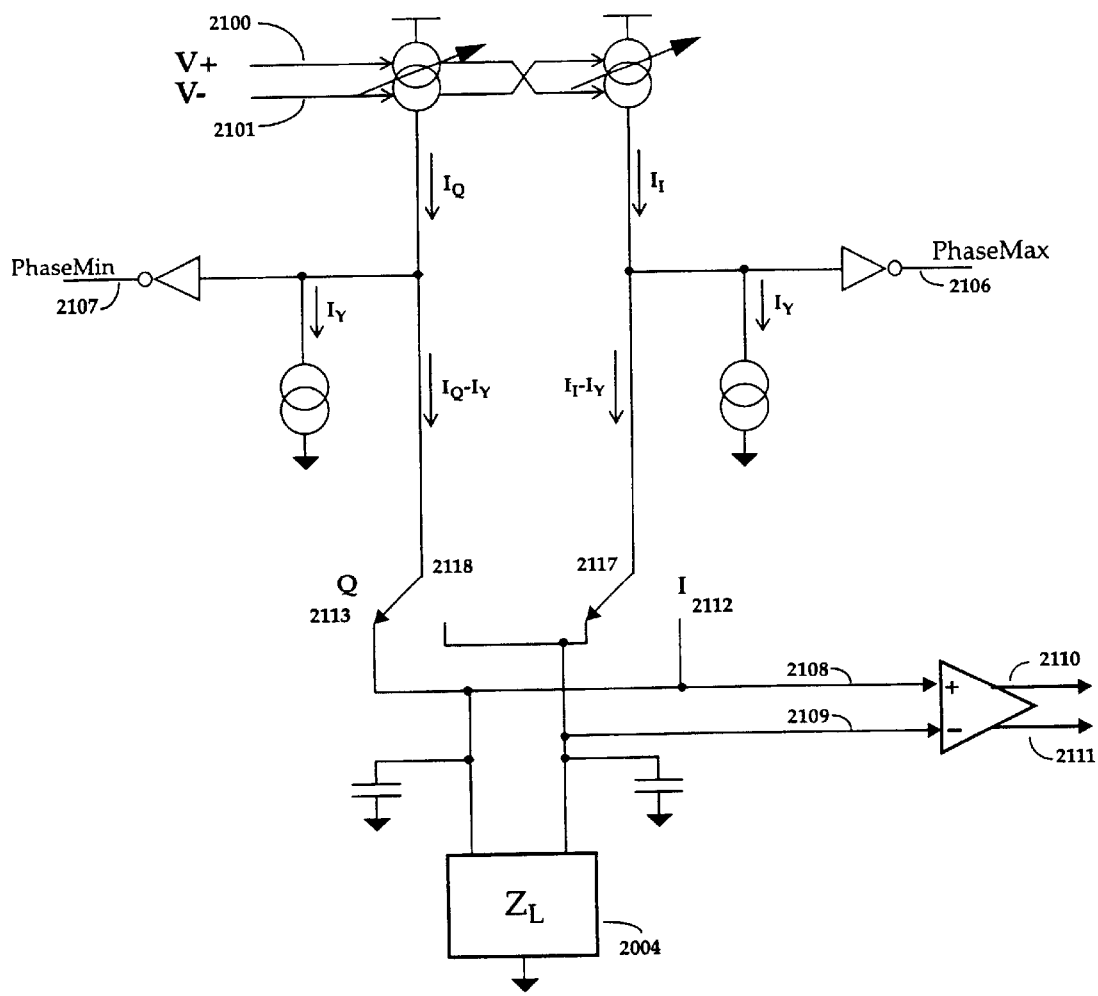
FIG_6

FIG_7
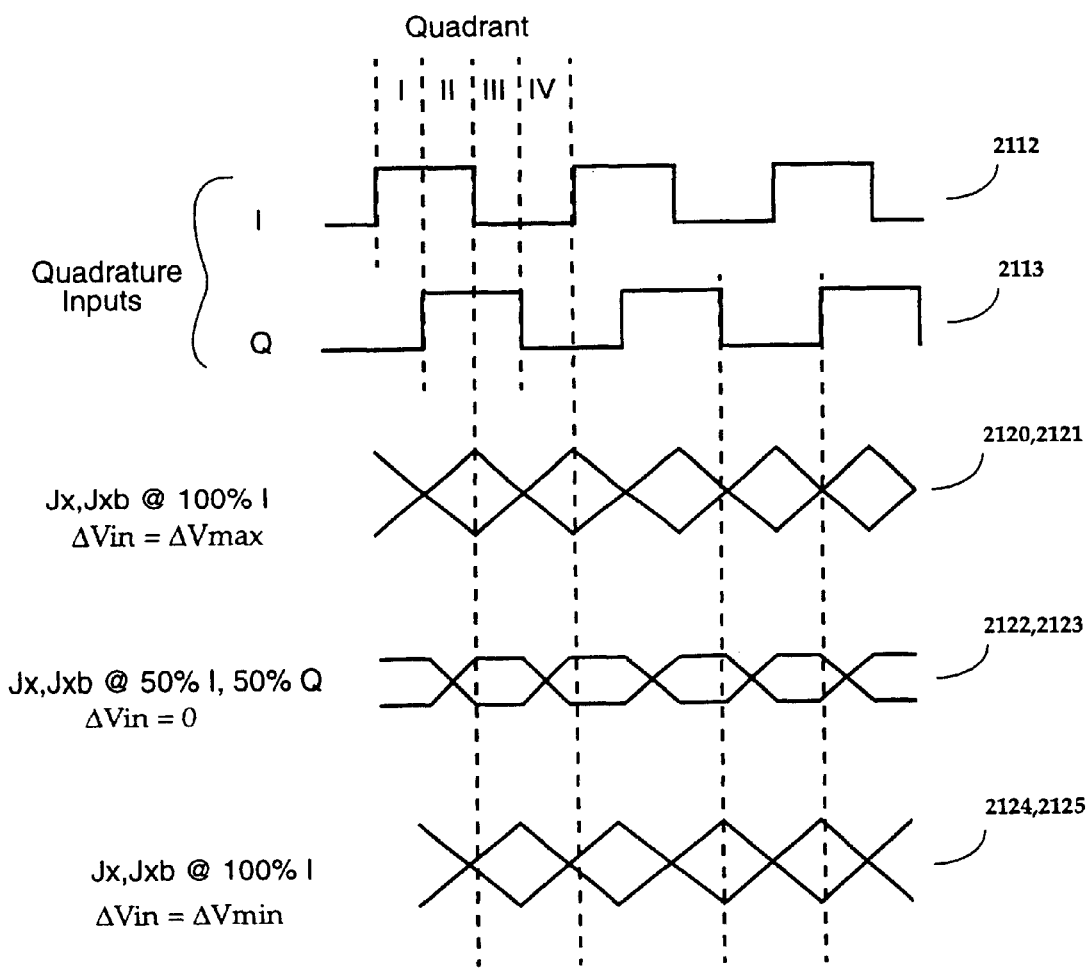

FIG_8
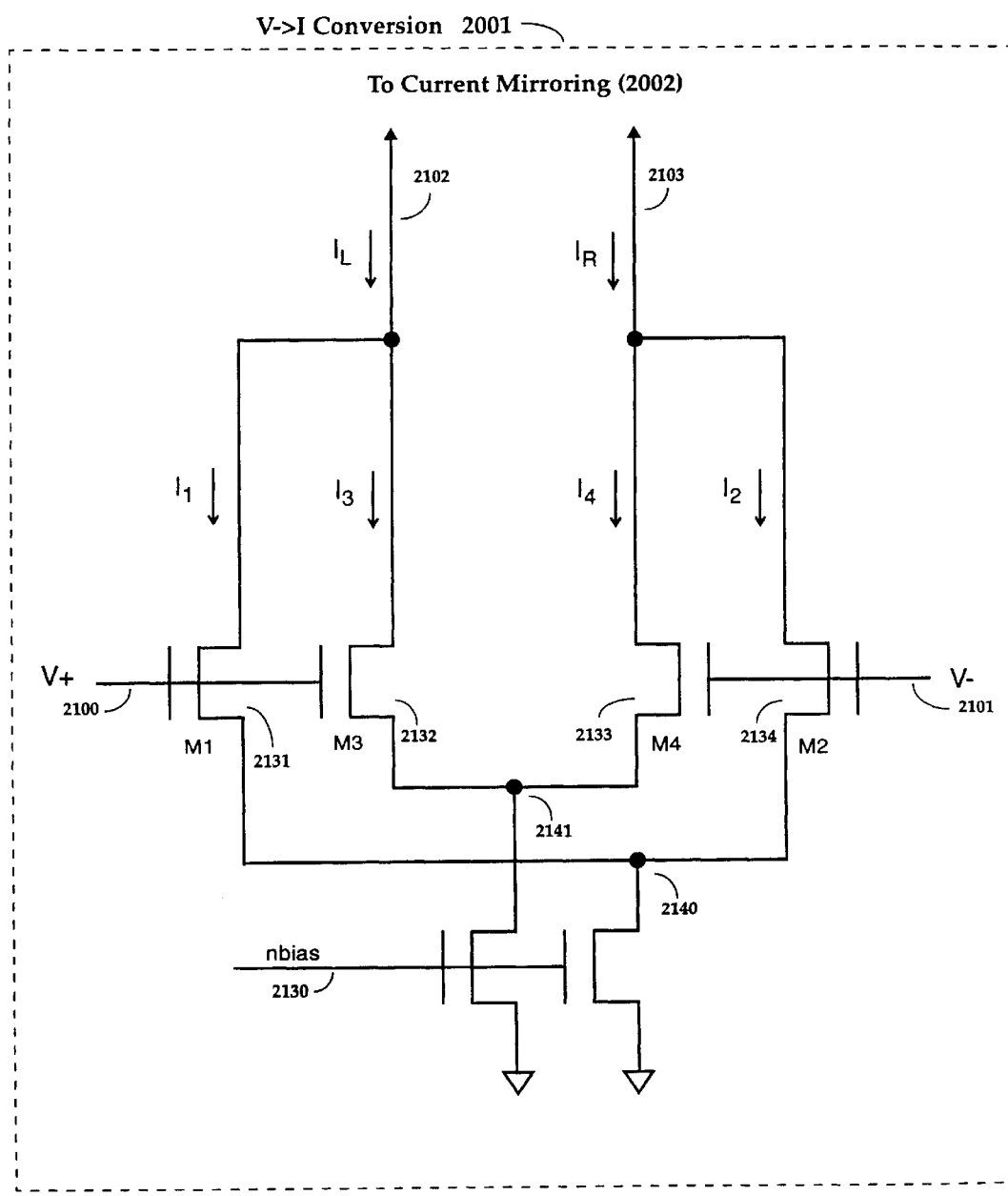

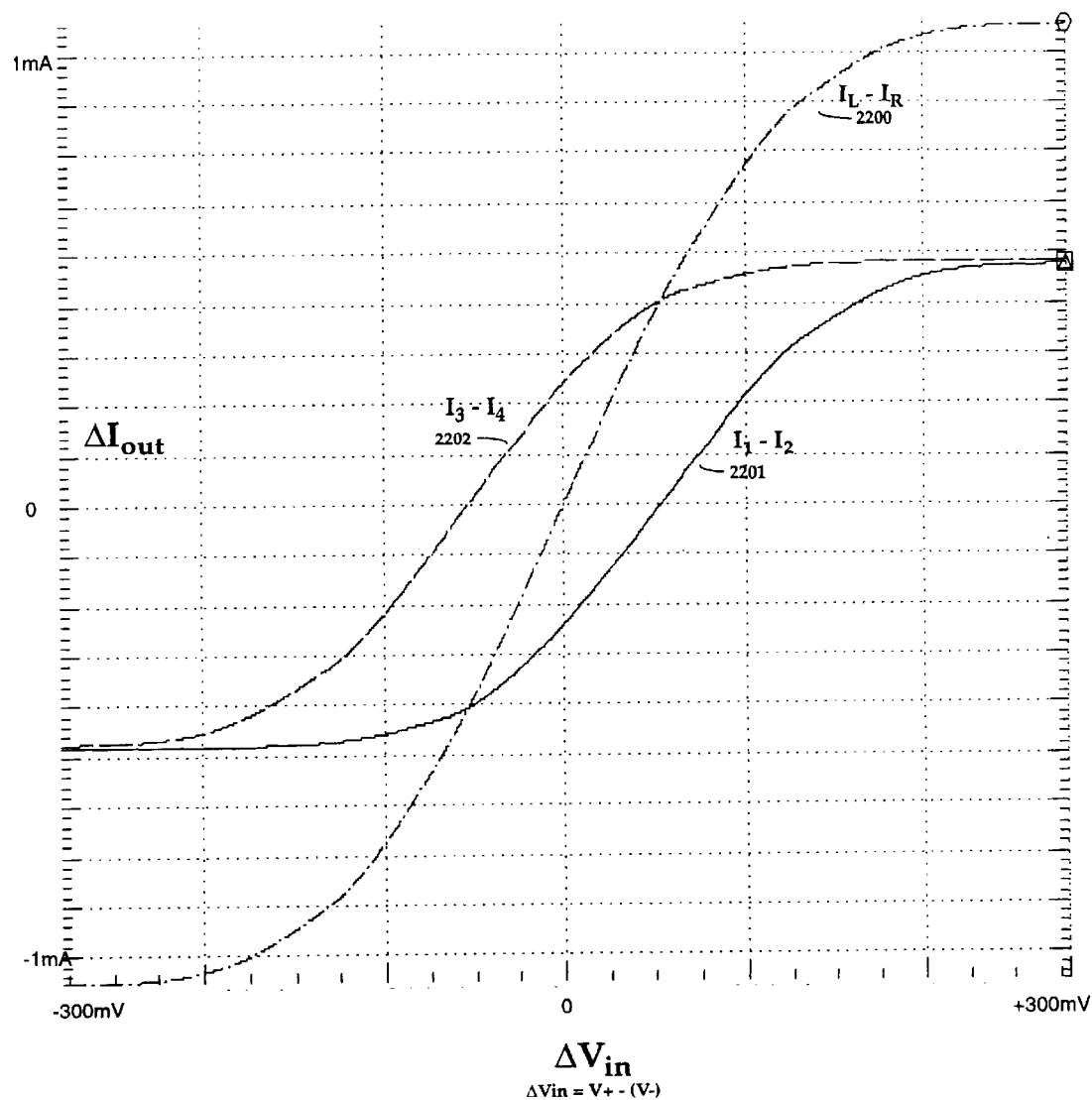
FIG_9

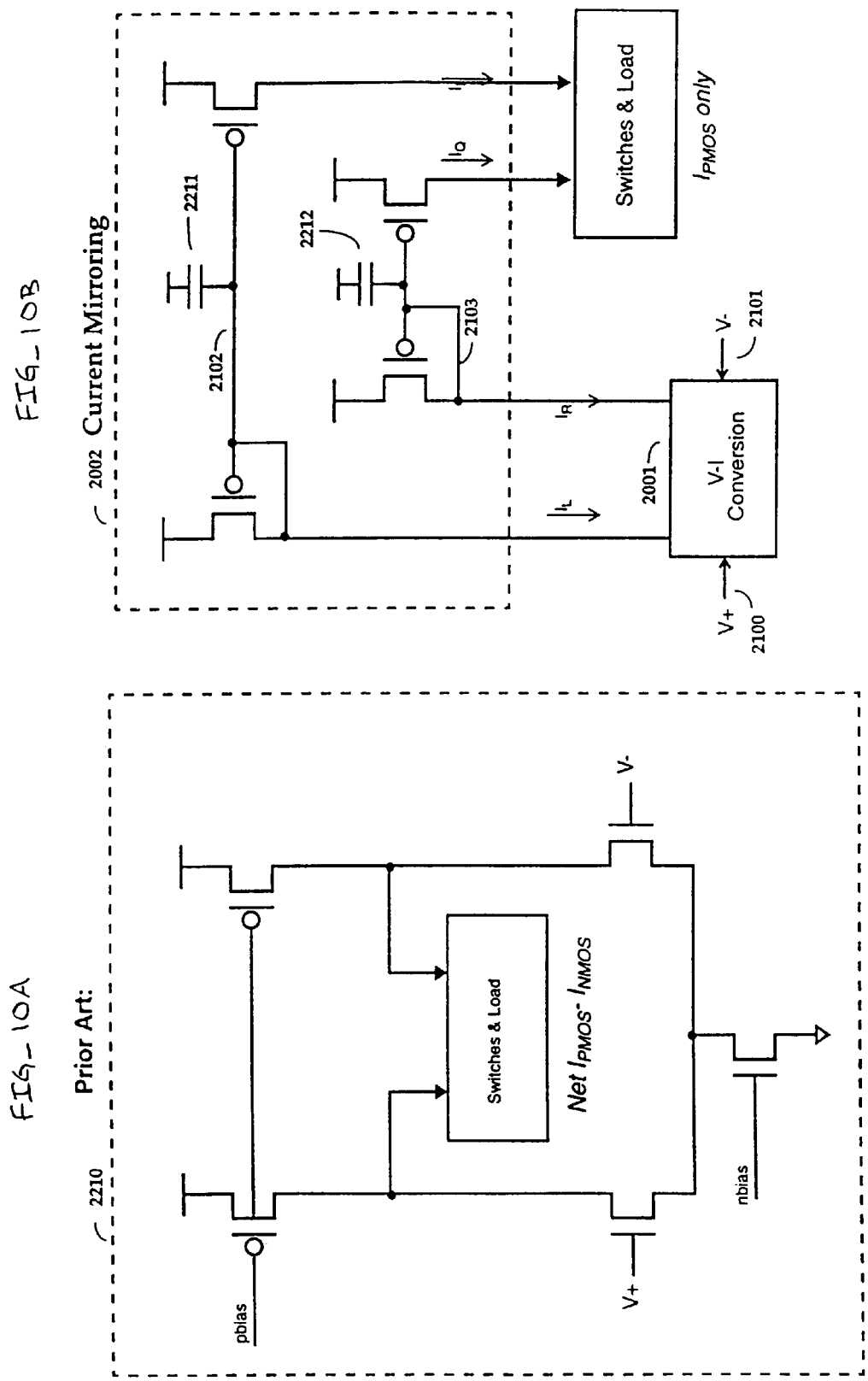

FIG_11
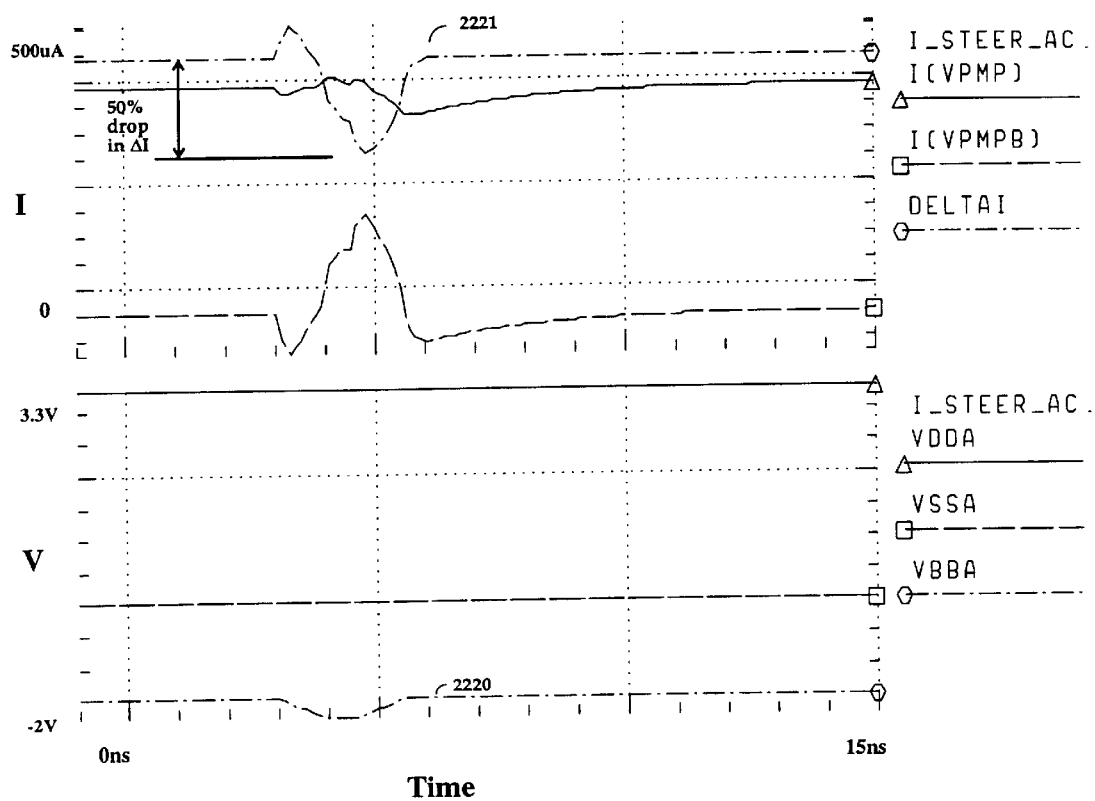

FIG_12
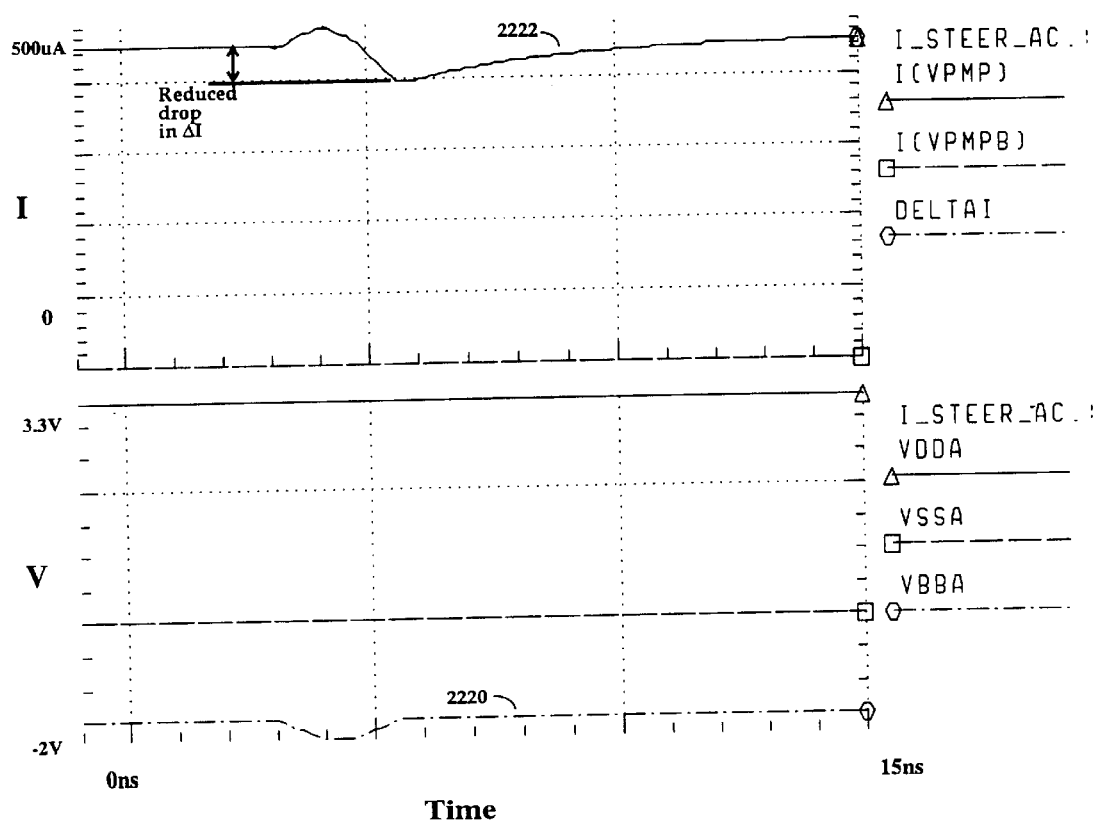

FIG_13
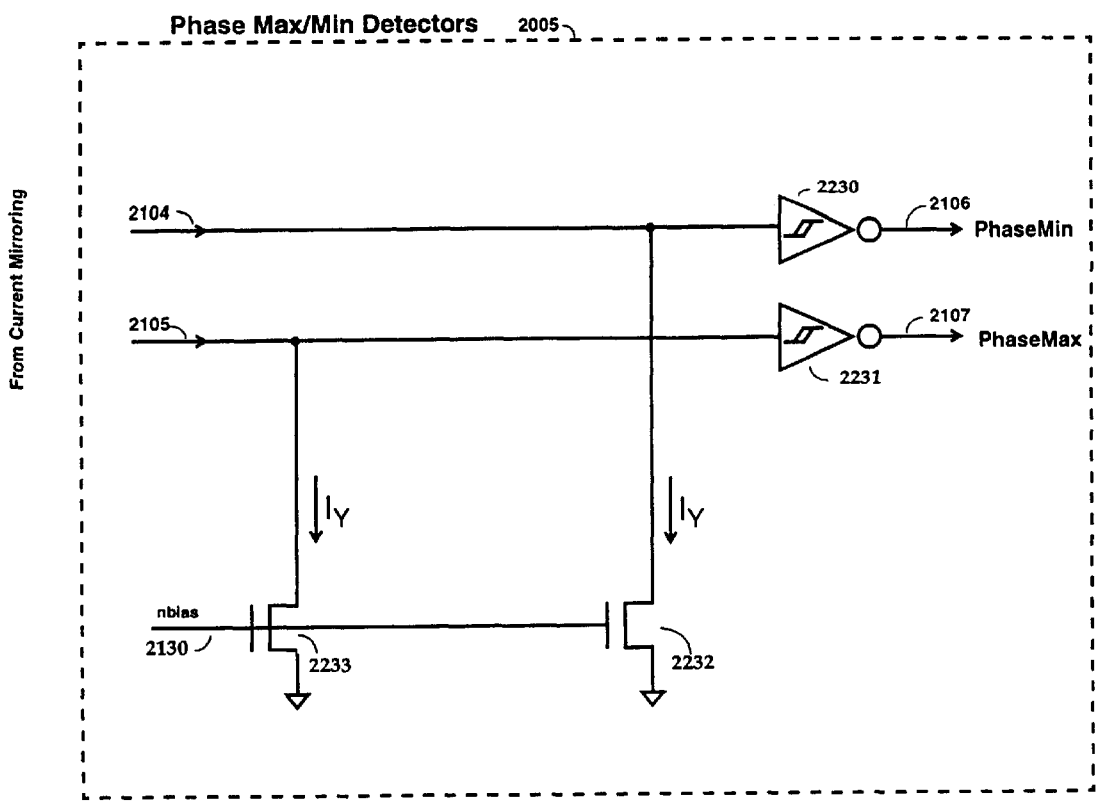

FIG_14
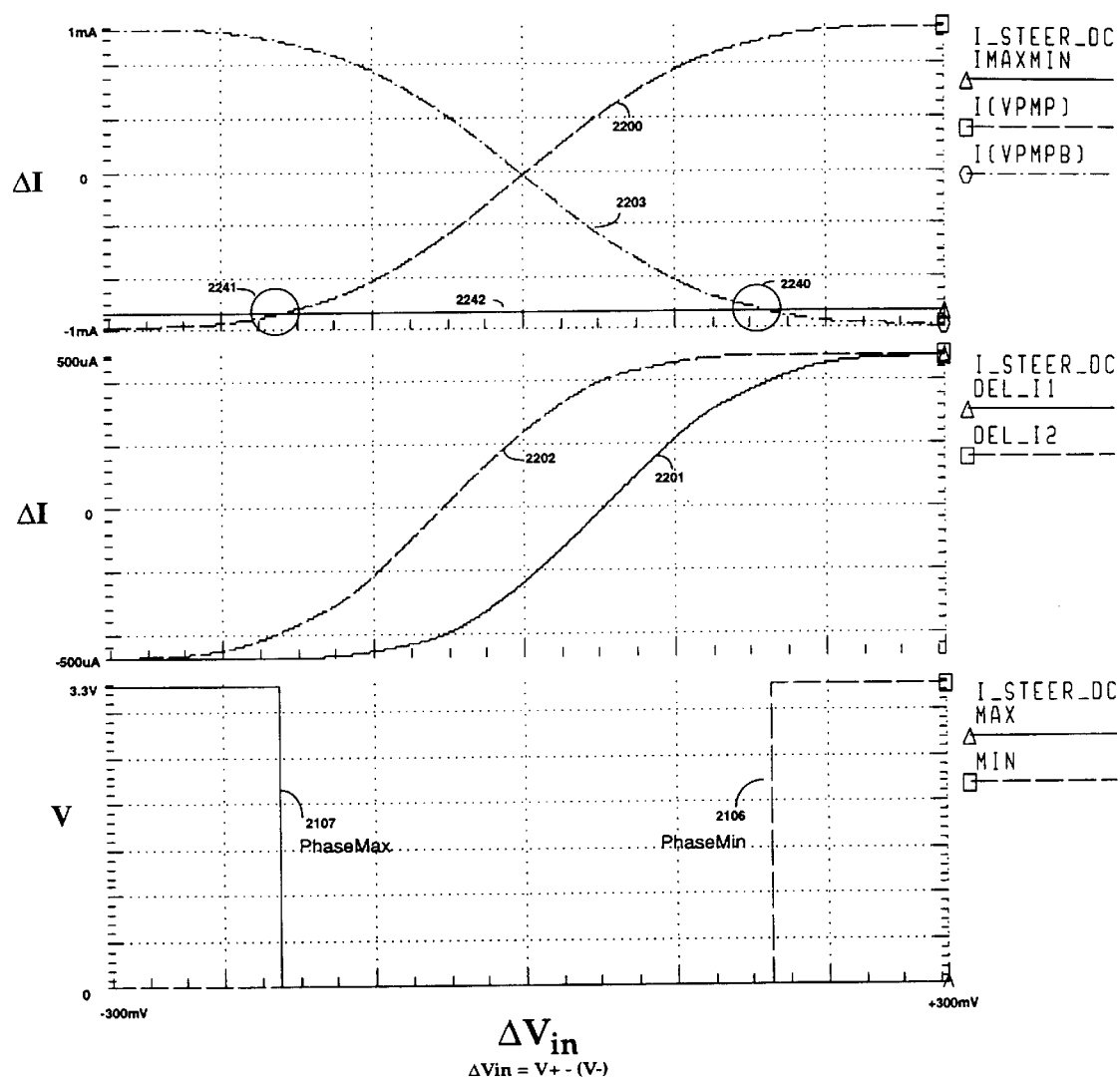

FIG_15
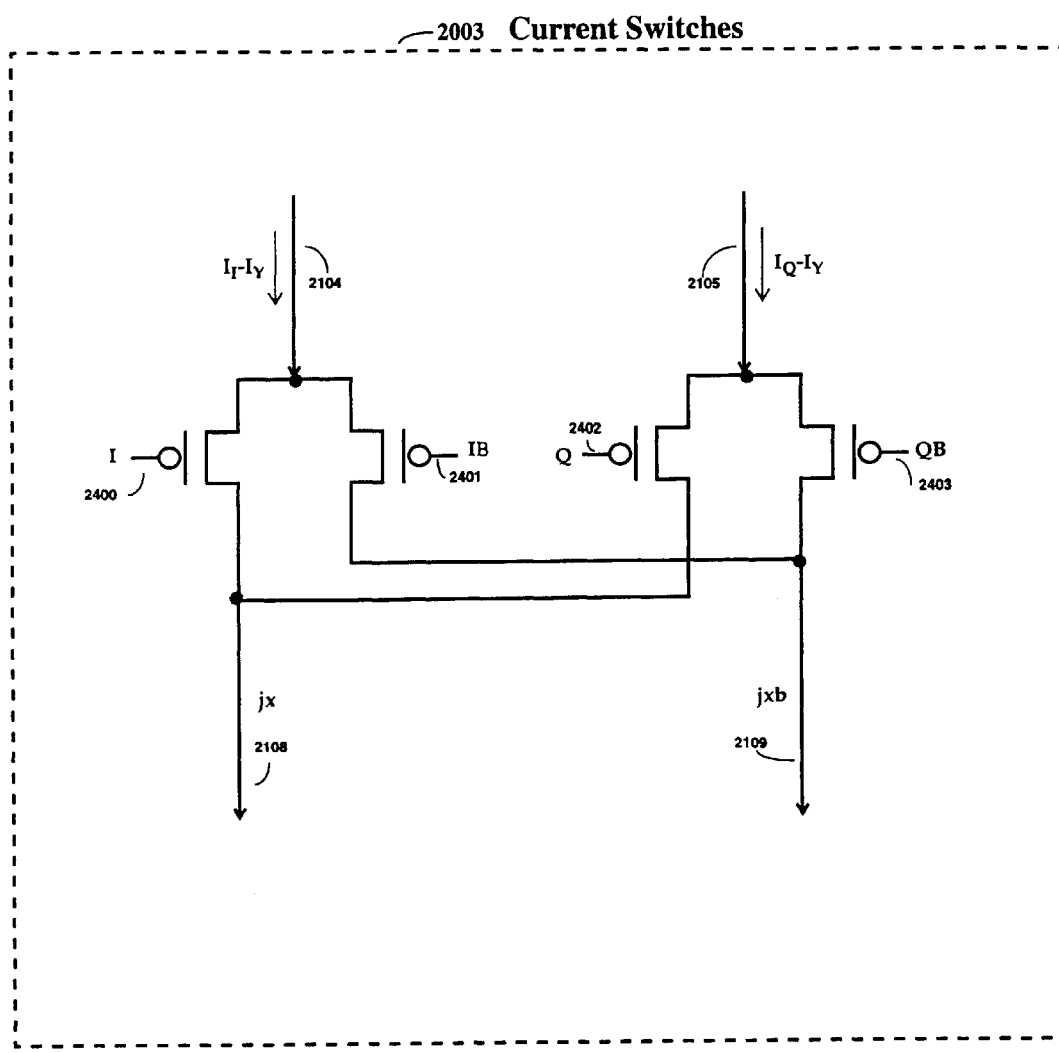

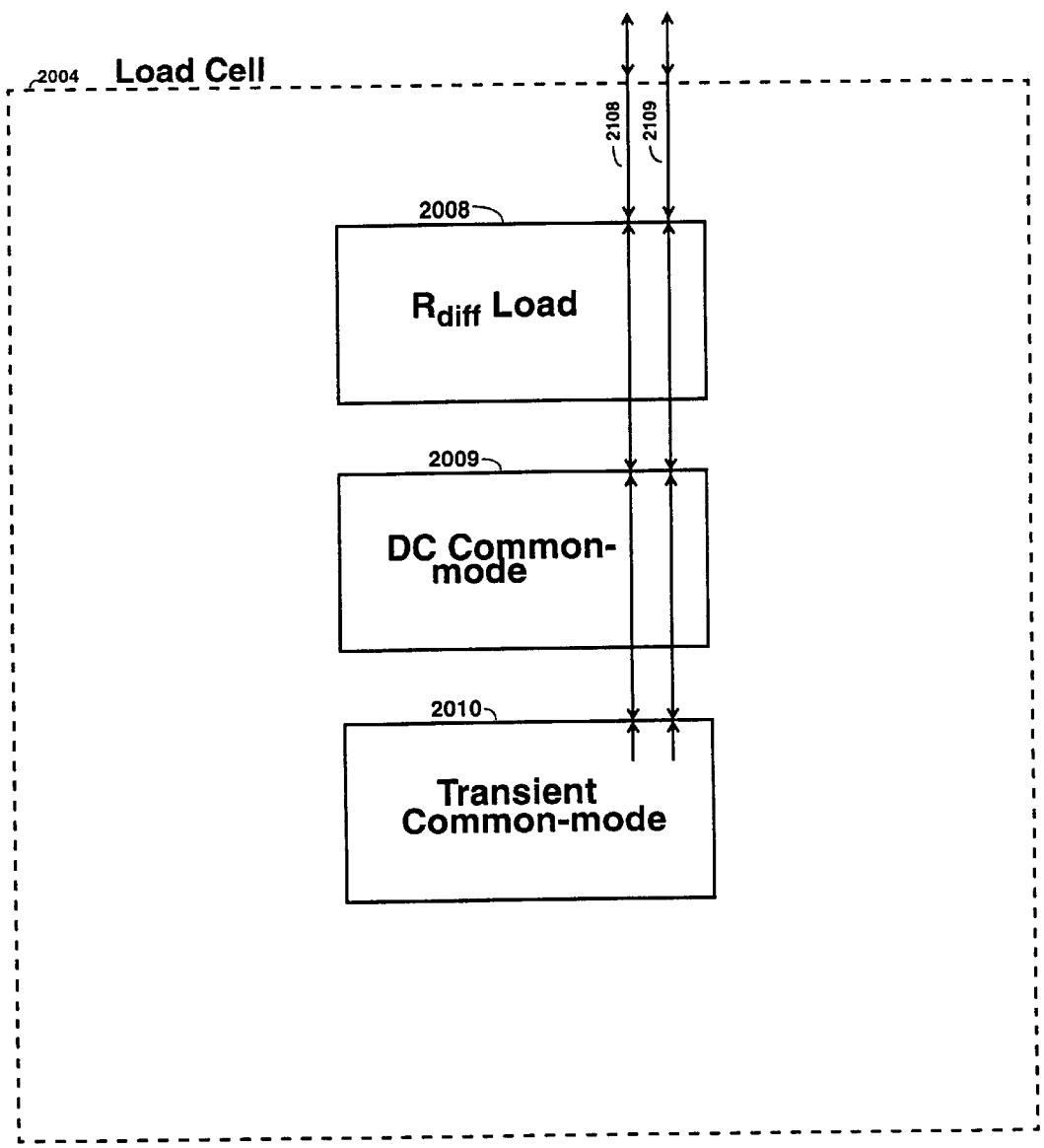
FIG_16

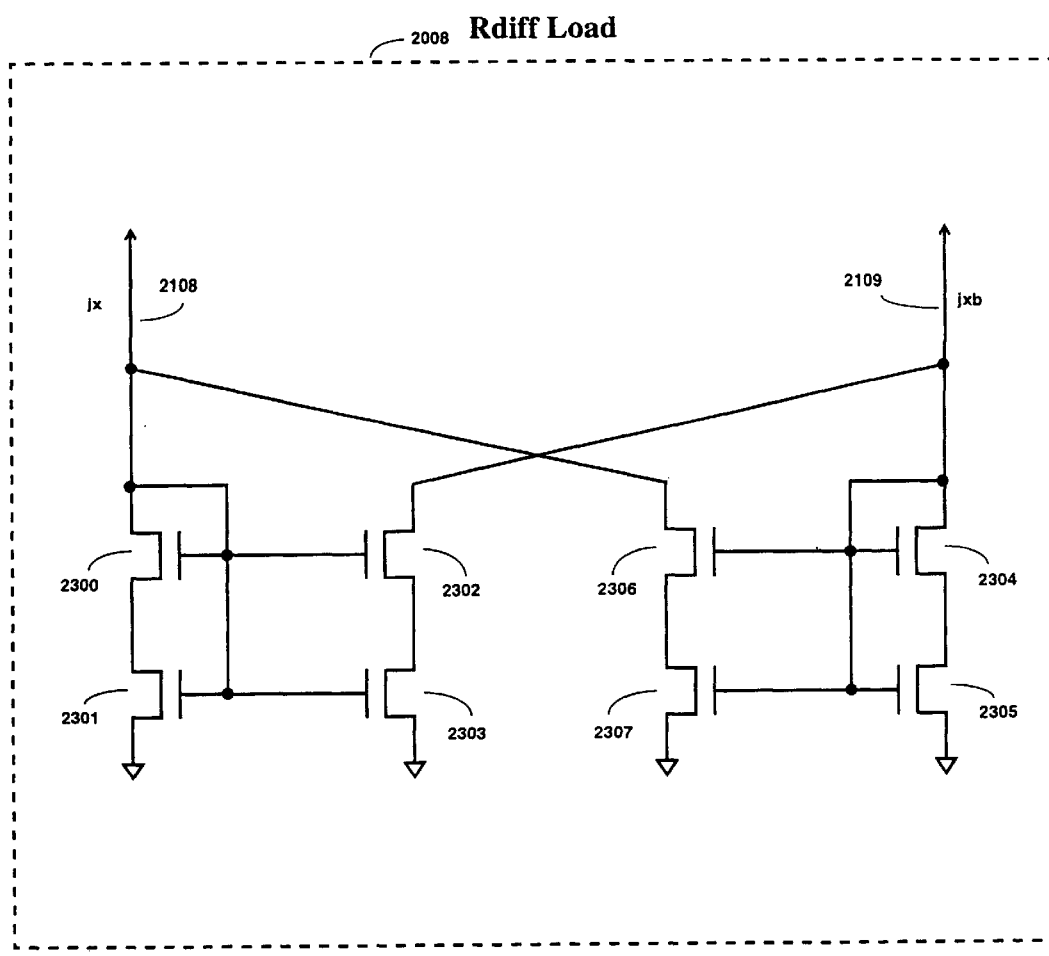
FIG_17

FIG_18
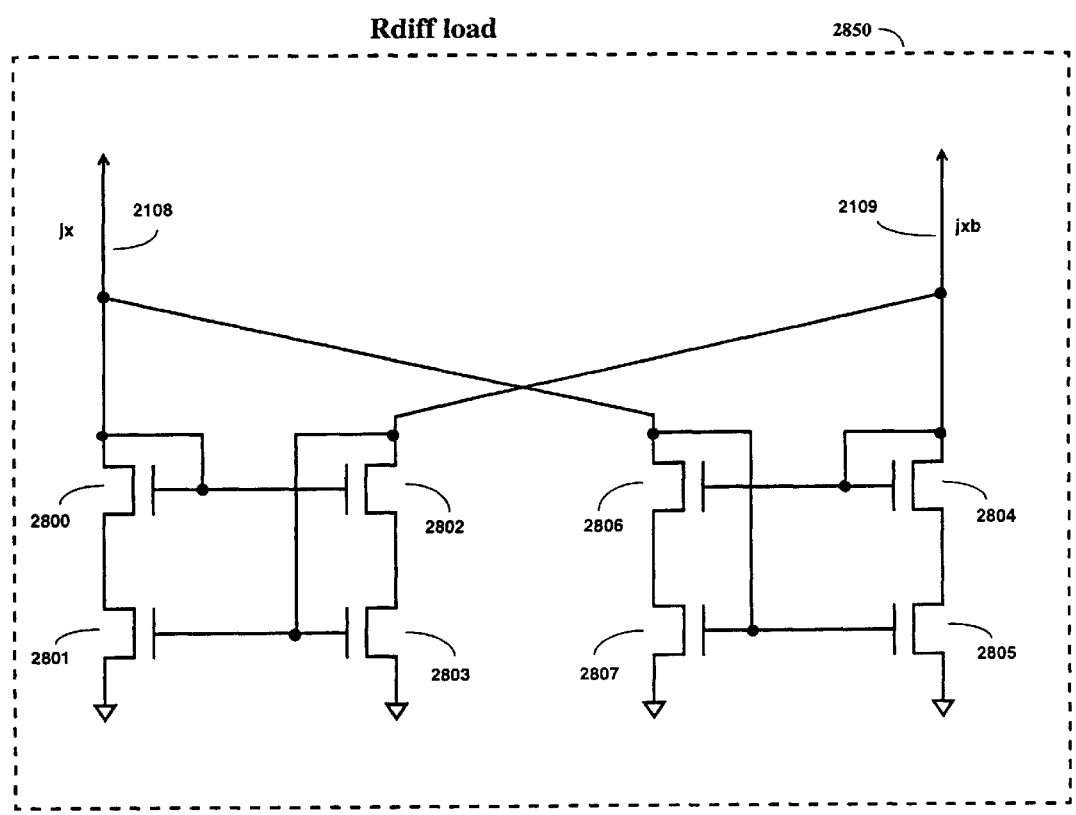

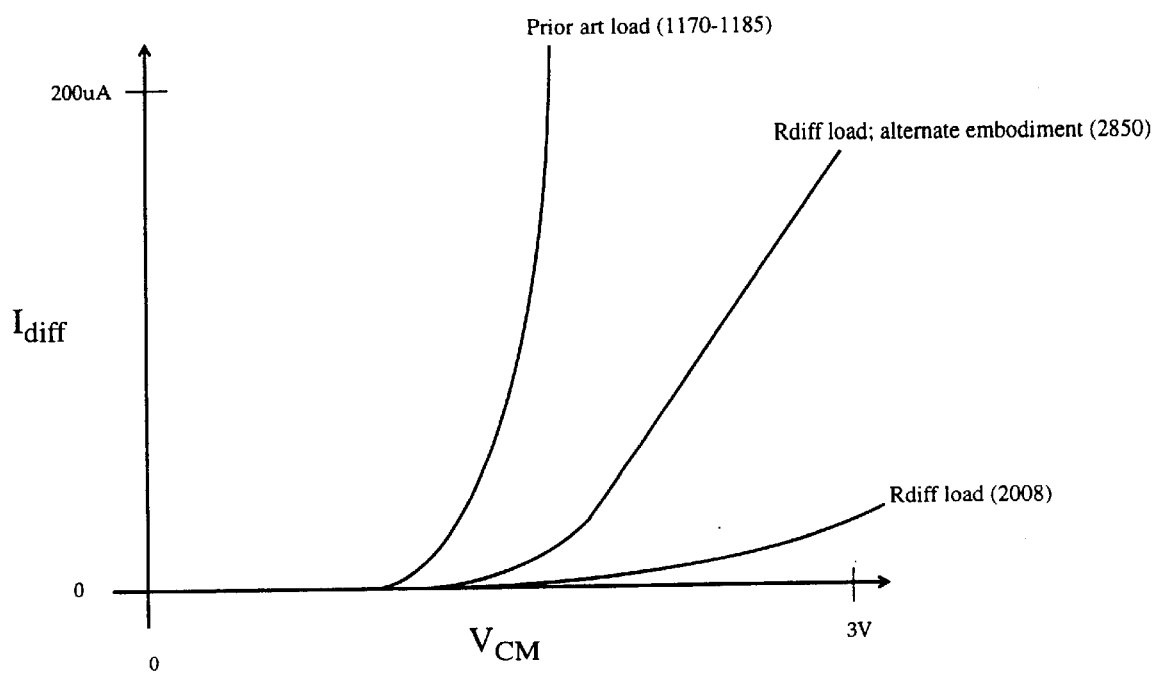
FIG_19

FIG_20
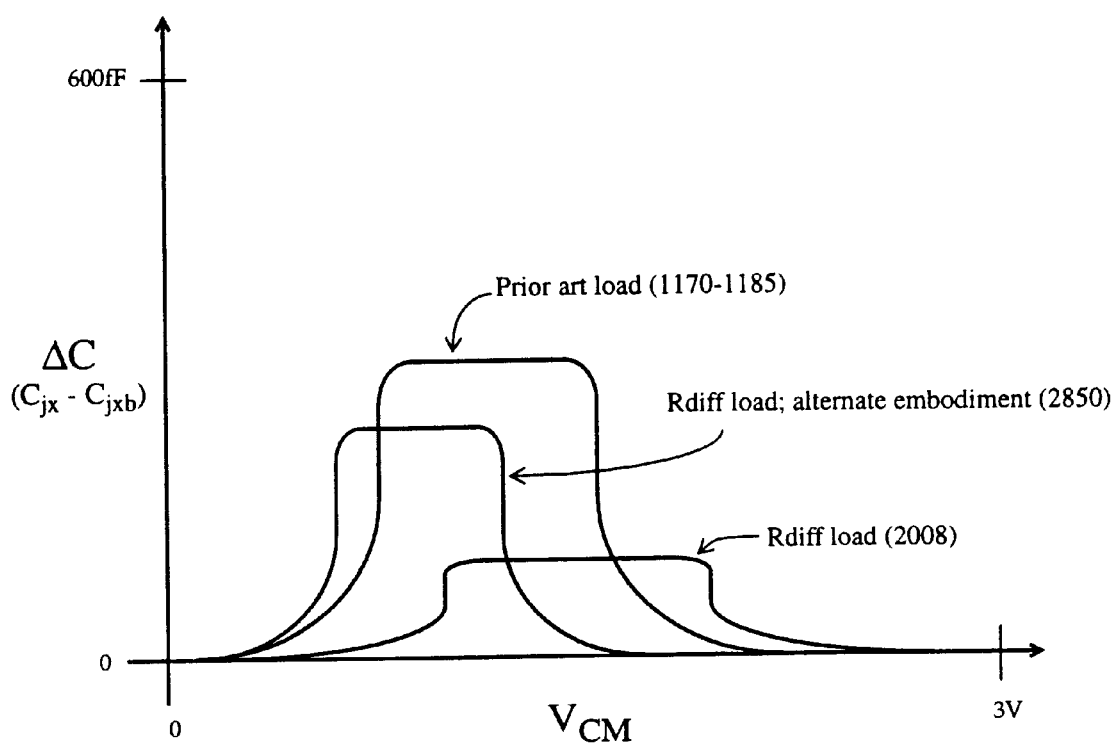

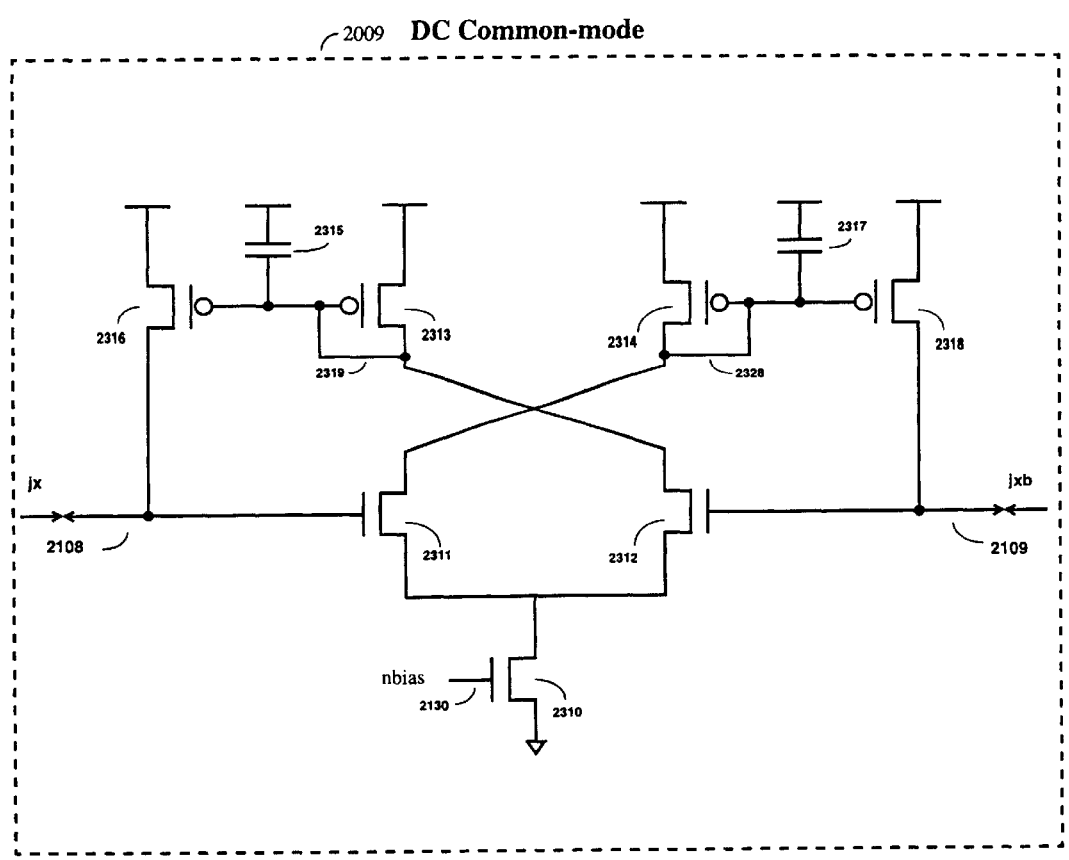
FIG_21

FIG_22
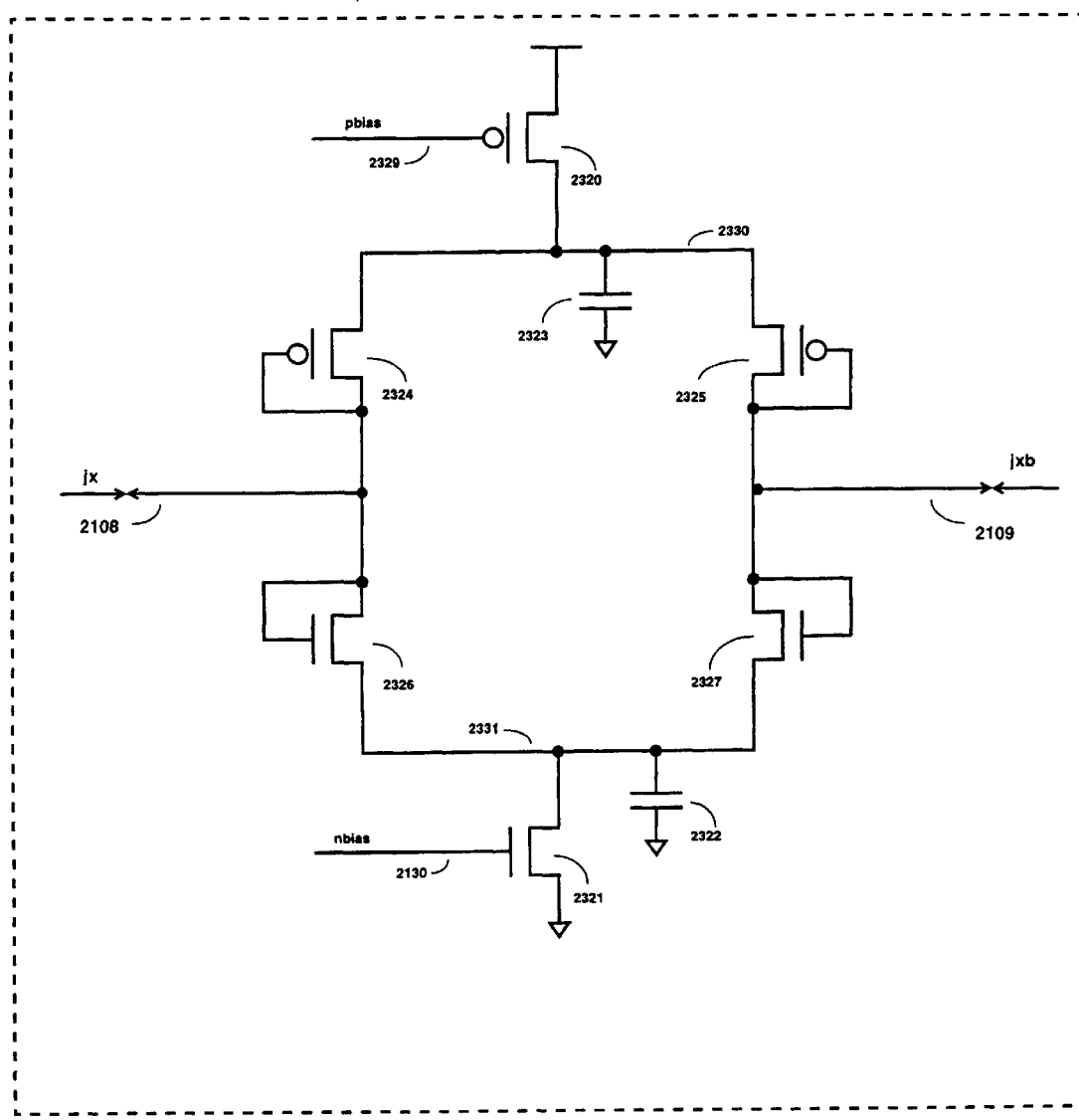

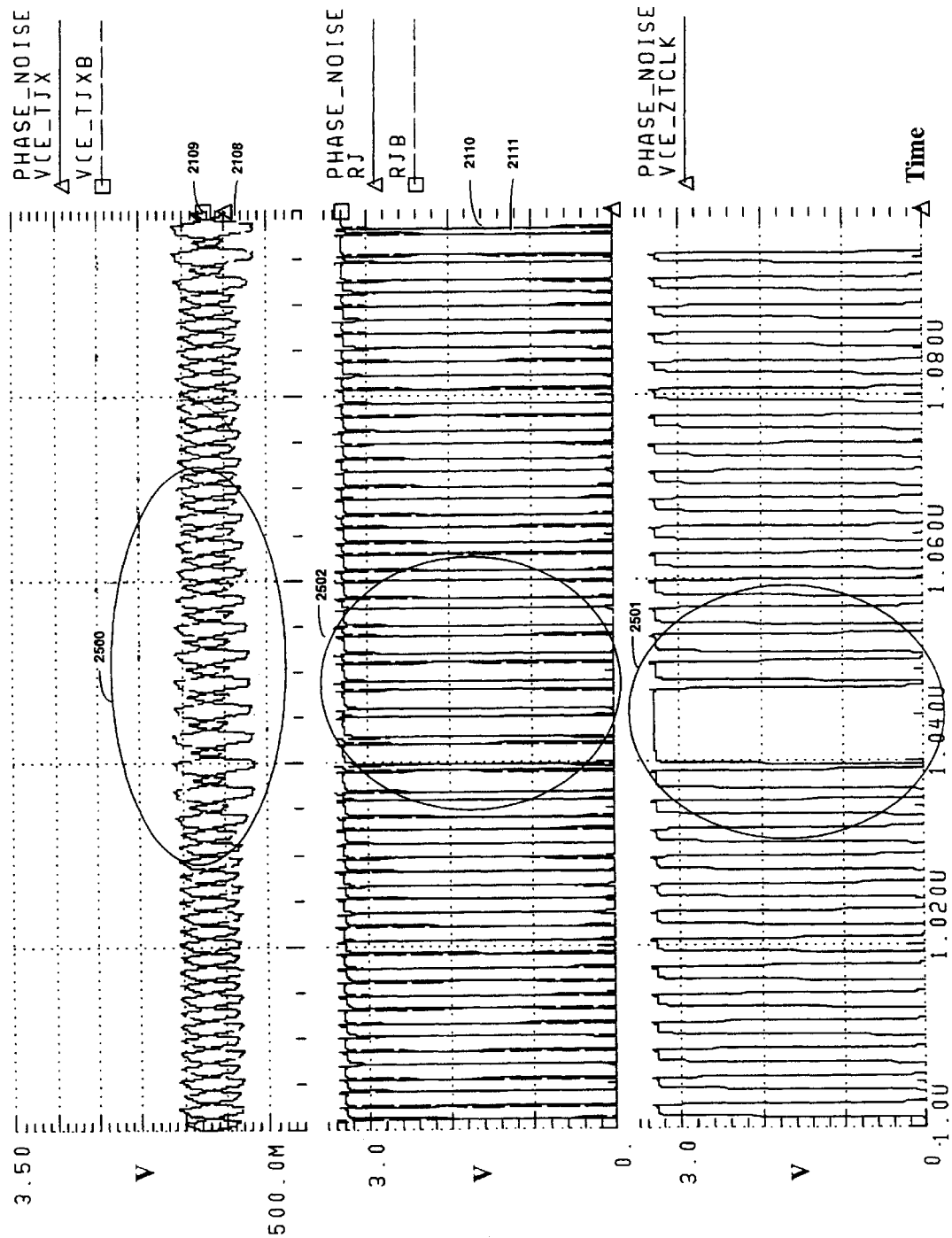
FIG_23

FIG_24
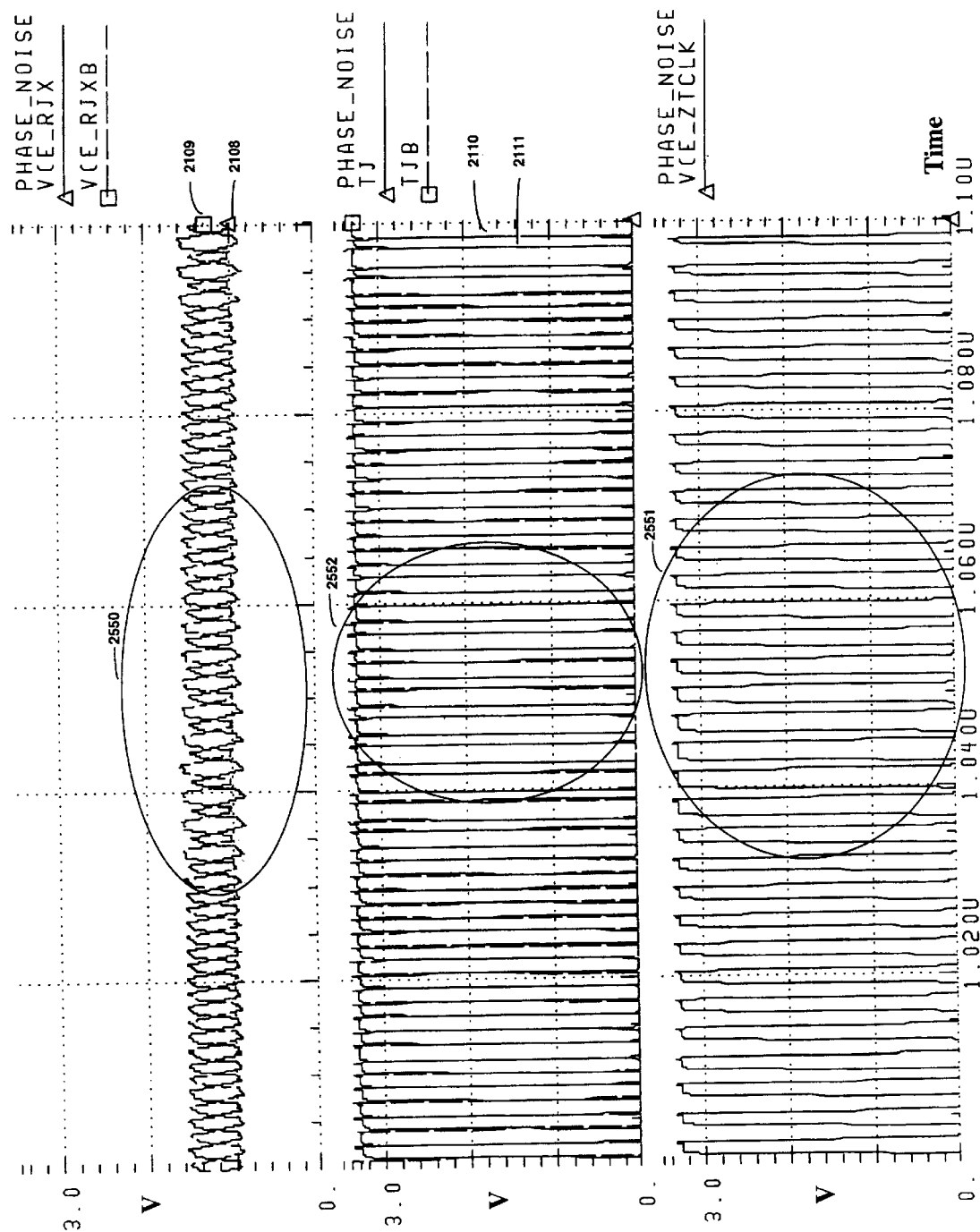

FIG_25
Prior Art
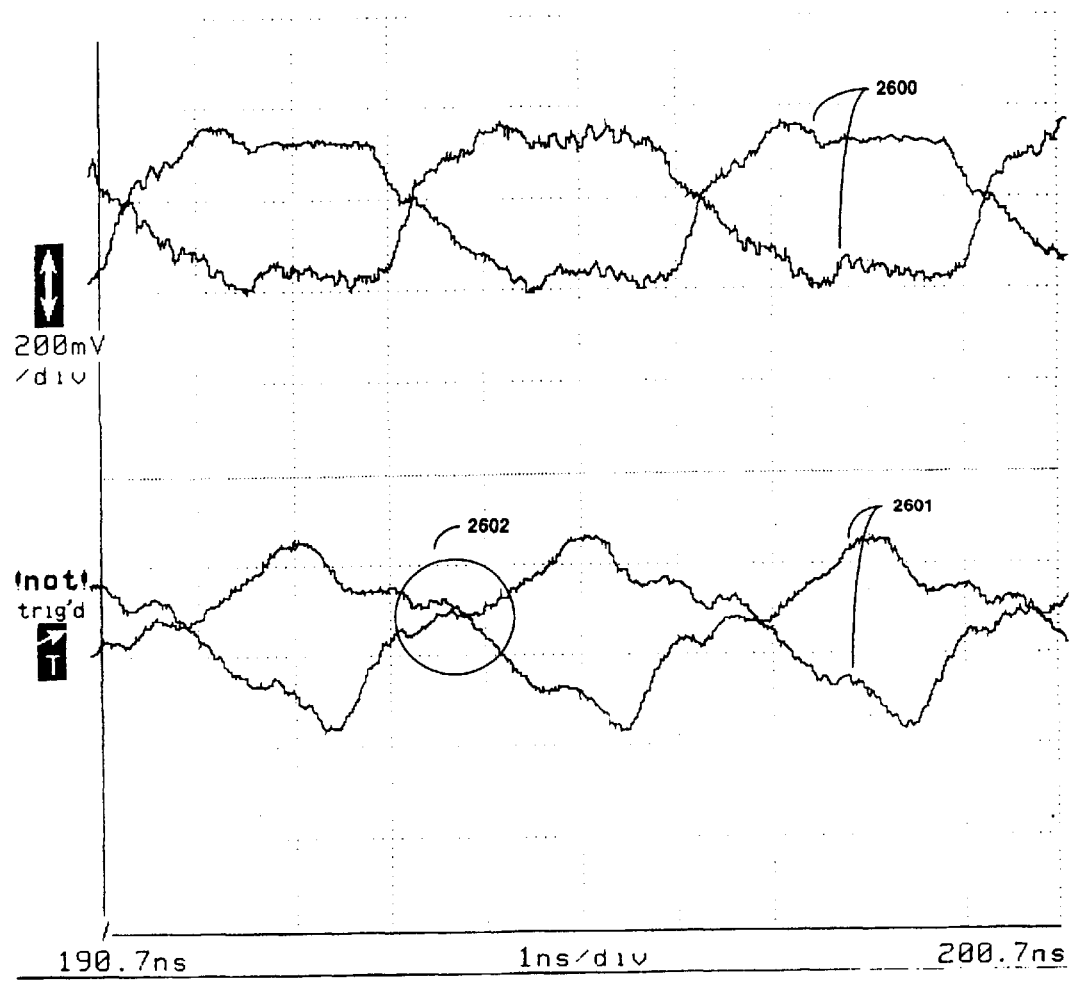

FIG_26
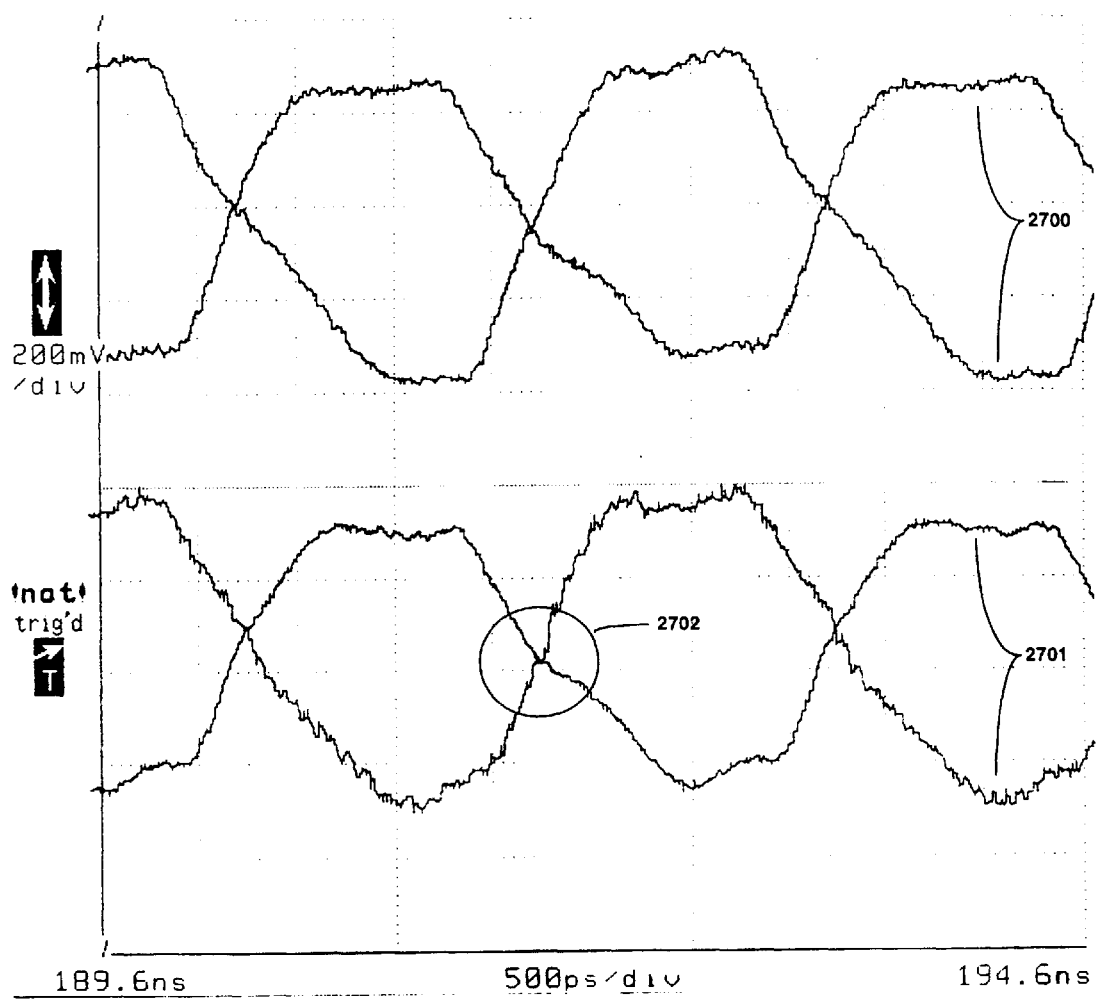

FIG_27
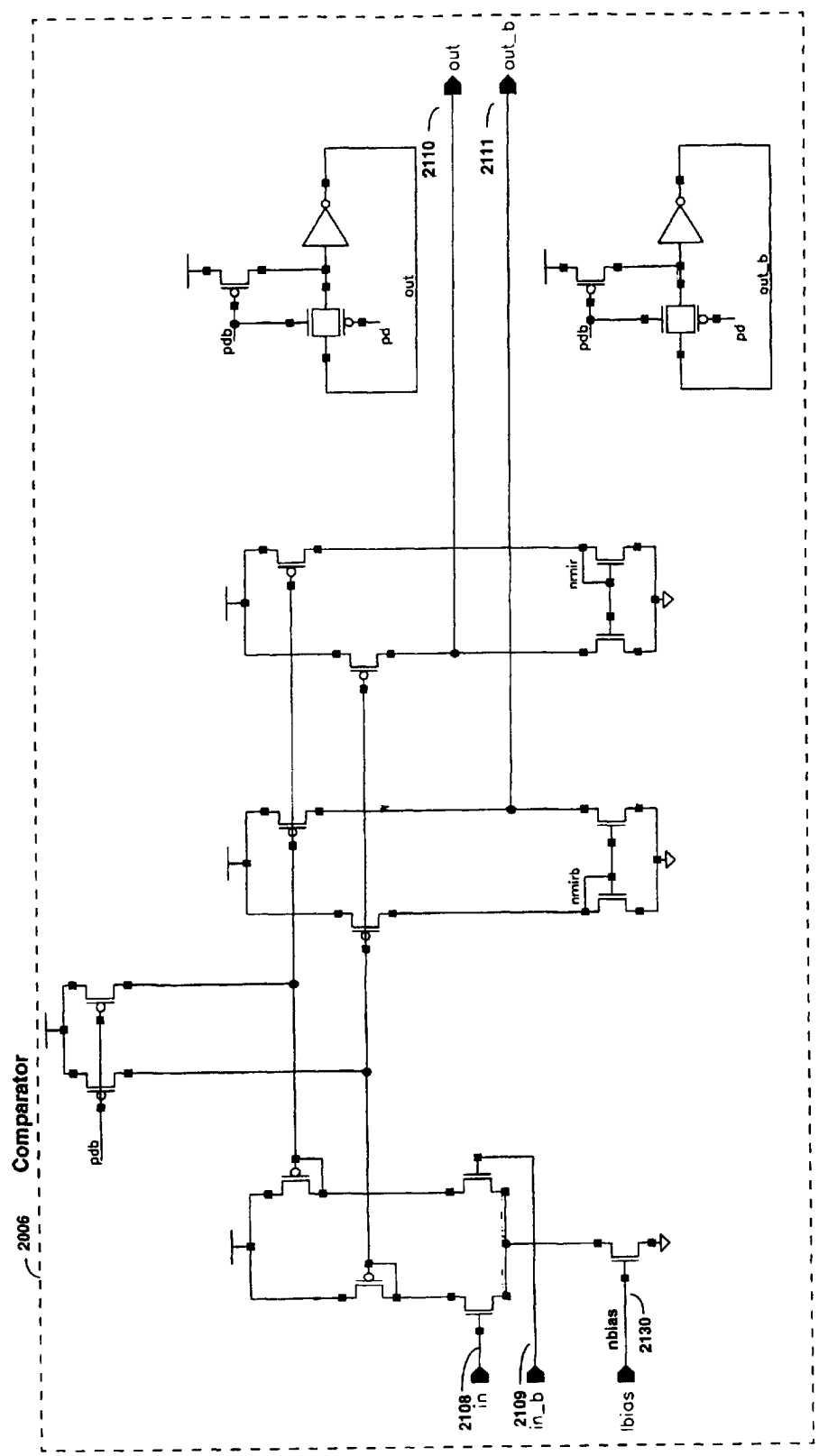

FIG_28
Prior art: output clock (2110)
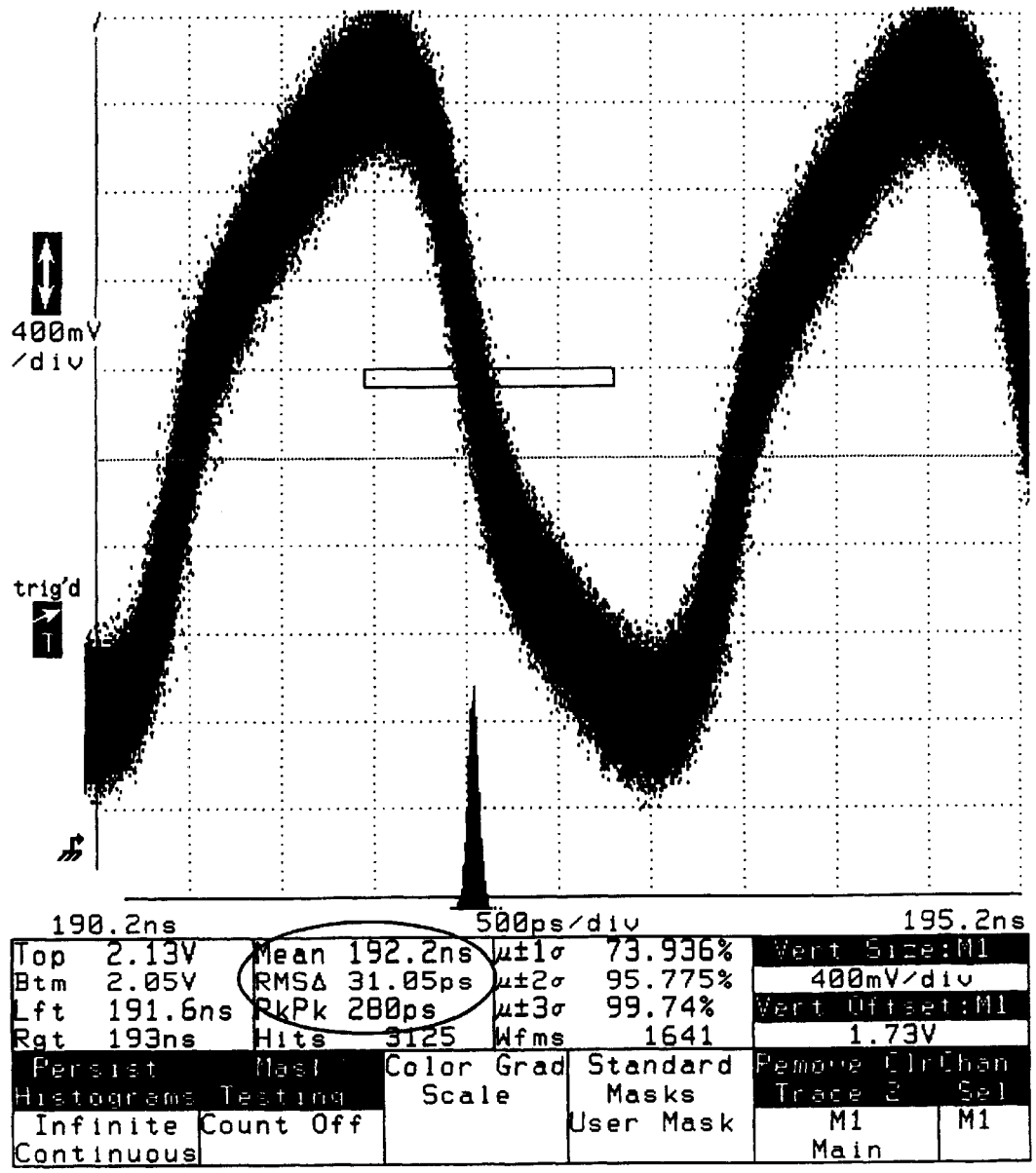

FIG_29
Output clock (2110)
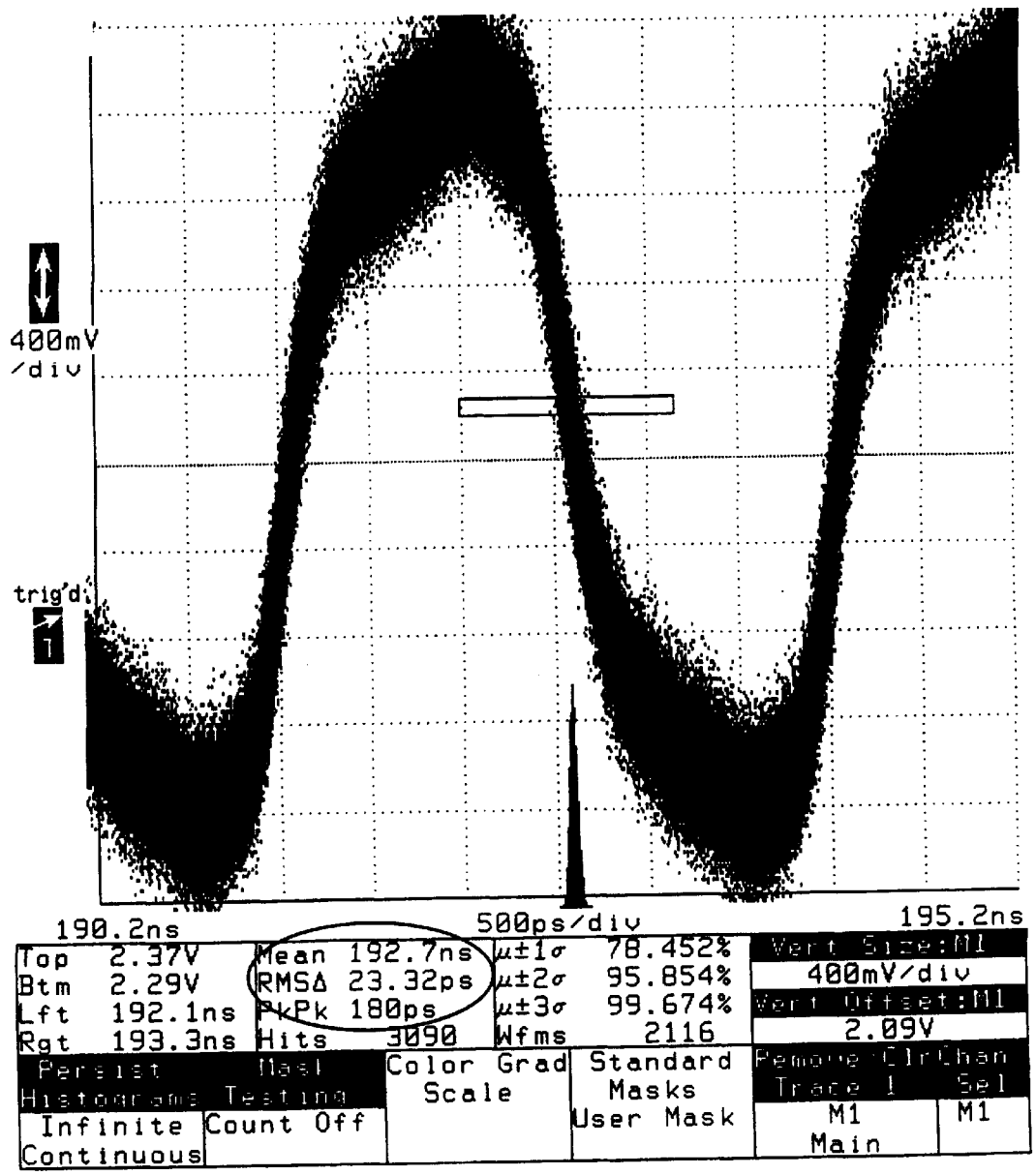

METHOD AND APPARATUS FOR PHASE INTERPOLATION

The present application is a continuation under 37 C.F.R. § 1.53(b) of U.S. patent application Ser. No. 09/016,084, filed Jan. 30, 1998, now U.S. Pat. No. 6,111,445.

FIELD OF THE INVENTION

The present invention relates to phase interpolators.

BACKGROUND

Phase interpolation is a useful technique in the generation of repetitive waveforms, such as device clocks. In phase interpolation input clocks are supplied which are phase offset from each other to a phase interpolator. The phase interpolator then has the ability to adjust its output to any phase-angle between the input clocks. This technique is very useful in the area of delayed locked loops (DLLs) and phase locked loops (PLLs) as well as most delay-matching circuitry. Phase interpolation is particularly useful in the phase shifting circuit of FIG. 1.

Some conventional phase interpolators are susceptible to output jitter. For example, the phase interpolator described in U.S. Pat. No. 5,554,945 of Lee et al. (see FIG. 2) is strongly susceptible to output jitter when there is noise on the bulk bias supply Vbb. It would be desirable to have a phase interpolator that was less susceptible to output jitter when there is noise on a Vbb supply.

Some conventional phase interpolators also require that input vectors or clocks be very closely spaced. For example, the phase interpolator disclosed in A SEMI-DIGITAL DUAL DELAY-LOCKED LOOP, IEEE Journal of Solid-State Circuits, Vol. 32, No. 11, by Sidiropoulos and Horowitz, generally requires that the rise/fall times of the input waveforms must overlap for good interpolation. This often results in smaller frequency range if the interpolator is used in a PLL/DLL application, or a requirement for the generation of multiple very finely spaced input vectors. It would be desirable to have a phase interpolator that did not require the input vectors to be as closely spaced as in conventional designs.

SUMMARY OF THE INVENTION

A phase interpolator circuit includes a first adjustable current supply to generate a first current that is based on the amplitude of a first control voltage and a first current mirror circuit to generate a second current that is based on the first current. The phase interpolator circuit further includes a first current steering switch to steer the second current to one of first and second nodes to generate a first voltage transition at one of the first and second nodes, the second current being steered to the first node when a first input signal is in a first state and to the second node when the first input signal is in a second state.

A phase interpolator with noise immunity is described. The phase interpolator includes a voltage-to-current conversion circuit that receives a differential voltage and generates a differential current. The differential current is mirrored and provided to a phase Max/Min detector circuit and current switches. The phase Max/Min detectors may generate signals for a phase selector circuit. The current switches provide the mirrored current to a phase comparator and a load circuit in response to input vectors and a quadrant select signal. The phase comparator generates output waveforms from the phase interpolator.

The present invention provides multiple advantages over conventional phase interpolators. This invention provides outputs with lower output jitter. One way this is done is via significantly better noise rejection, both from the Vbb and Vdd supply. This invention has much lower Vbb sensitivity than the phase interpolator of U.S. Pat. No. 5,554,945. It also has fewer stacked series devices, allowing for better Vdd noise rejection and operation at low supply voltages. The present invention also provides integrated interpolation waveforms of much higher quality. This minimizes jitter in what is normally the worst area, the low-swing to high-swing amplification of a comparator. This invention gives waveforms with larger swing and better dV/dT at the crosspoint. Providing better waveforms to the comparator minimizes jitter created by the low-swing to high-swing amplification.

This invention also uses the integration of current into capacitance instead of phase-blending to avoid the tight spacing requirement and has superior performance over Sidiropoulos et al. when presented with input clocks whose spacing is greater than their rise/fall time.

Other objects, features, and advantages of the present invention will be apparent from the accompanying drawings and from the detailed description which follows below.

BRIEF DESCRIPTION OF THE DRAWINGS

The features and advantages of the present invention are illustrated by way of example and are by no means intended to limit the scope of the present invention to the particular embodiments shown, and in which:

FIG. 1 is a block diagram of a conventional phase shifter;

FIG. 2 is a block diagram of a conventional phase interpolator;

FIG. 3 is a circuit diagram of a conventional quadrant boundary detector;

FIG. 4 is a circuit diagram of a conventional phase interpolator;

FIG. 5 is a block diagram of one embodiment of a phase interpolator according to the present invention that includes a V–>I conversion circuit, a current mirroring circuit, phase Max/Min detectors, current switches, a load cell circuit, and a phase comparator;

FIG. 6 is a one embodiment of a circuit diagram of the phase interpolator of FIG. 5;

FIG. 7 is an exemplary waveform diagram illustrating the operation of the circuit of FIG. 6;

FIG. 8 is a circuit diagram of one embodiment of the V–>I conversion circuit of FIG. 5;

FIG. 9 is a graph of the currents flowing through the V–>I conversion circuit of FIG. 8;

FIG. 10A is a circuit diagram of a conventional current steering circuit;

FIG. 10B is a circuit diagram of one embodiment of differential current mirroring circuit of FIG. 5;

FIG. 11 is a graph of the impact of Vbb noise on the differential current supplied by the circuit of FIG. 10A to a load circuit;

FIG. 12 is a graph of the impact of Vbb noise on the net current supplied by the circuit of FIG. 10B to a load circuit;

FIG. 13 is a circuit diagram of one embodiment of the phase Max/Min detectors of FIG. 5;

FIG. 14 is a graph illustrating the operation of the phase Max/Min detectors of FIG. 13;

FIG. 15 is a circuit diagram of one embodiment of the current switches of FIG. 5;

FIG. 16 is a block diagram of one embodiment of the load circuit of FIG. 5 including an $R_{diff}$ Load circuit, a DC common-mode circuit, and a transient common-mode circuit;

FIG. 17 is a circuit diagram of one embodiment of the $R_{diff}$ Load circuit of FIG. 16;

FIG. 18 is a circuit diagram of another embodiment of the $R_{diff}$ Load circuit of FIG. 16;

FIG. 19 is a graph of $I_{diff}$ v. $V_{CM}$ for the circuits of FIGS. 16 and 17;

FIG. 20 is a graph of $\Delta C$ v. $V_{CM}$ for the circuits of FIGS. 16 and 17;

FIG. 21 is a circuit diagram of one embodiment of the DC common-mode circuit of FIG. 16;

FIG. 22 is a circuit diagram of one embodiment of the transient common-mode circuit of FIG. 16;

FIG. 23 is a graph of short-term duty cycle noise on a conventional interpolator;

FIG. 24 is a graph illustrating the operation of the transient common-mode circuit of FIG. 22;

FIG. 25 is a graph of signals provided to a load circuit under quiet and noisy conditions of a conventional phase interpolator;

FIG. 26 is a graph of signals provided to the load circuit of the present invention under quiet and noisy conditions;

FIG. 27 is a circuit diagram of one embodiment of the comparator of FIG. 5;

FIG. 28 is a graph of the output waveforms generated by a conventional phase interpolator; and FIG. 29 is a graph of one embodiment of the output waveforms generated by the phase interpolator of the present invention.

DETAILED DESCRIPTION

A block diagram of phase interpolator 2000 according to the invention is shown as FIG. 5. The input vectors I 2112 and Q 2113 are inputs to the current switch block 2003, and the analog control voltage made up of V+ 2100 and V− 2101 are inputs to V–I conversion block 2001. Small swing differential outputs jx 2108 and jxb 2109 are amplified by PhaseComparator 2006 to generate the final full-swing outputs 2110 and 2111. An overview of the operation of the total circuit will be followed by a detailed description of each of the sub-blocks.

A conceptual diagram of the circuit operation is shown as FIG. 6. This, along with the basic waveform diagram of FIG. 7, shows the basic operation of the invention. Analog differential control voltages V+ 2100 and V− 2101 adjust the values of Vdd-supplied current $I_Q$ and $I_I$. This adjustment is done so that the sum of $I_Q$ and $I_I$ is substantially the same across the steering range, i.e., if the circuit is steered to be 100% $I_Q$, then $I_I$ is steered to 0% and visa-versa. Next both currents have a small Vss-based current $I_Y$ subtracted from them. The reasons for this subtraction will be come clear later. The net currents are then put into single-pole-single-throw (SPST) switches 2117 and 2118. The switches are controlled by input vector clocks I 2112 and Q 2113 which are phase-spaced at 90° from each other (note: as shown, switches 2117 and 2118 corresponds to quadrant I of FIG. 7). These switched currents are then put into capacitors 1900 and 1901 and a load circuit 2004. The capacitors are made up of both parasitic and explicit capacitances, and together with the switched currents form a current/capacitance integrator where $dV=(I/C)dt$. The load circuit 2004 serves to both set the common-mode and the differential impedance of the integrator. Finally the integrator small-swing outputs 2108 and 2109 are put into a comparator amplification stage 2006 to convert the interpolated clocks to full-swing CMOS outputs.

By observing FIG. 7 the circuit operation and the integration can be better understood. When the differential input $\Delta V_{in}$ (=V+−V−) is set to $\Delta V_{max}$, $I_I$ contains substantially all of the current, with $I_Q=I_Y$ and no net current to the Q-switch 2118. The I-current is then switched by the $I_I$ switch 2117, resulting in triangle waveforms 2120,2121 whose vertices are defined by the rise and fall transitions of Quadrature Input I 2112. As the pullup current to Vdd is switched on or off by switch 2117 controlled by I 2112, it is easily seen how this will result in a rising edge of the triangle waveform. Understanding the falling edge, however, requires an understanding of the load circuit. The load circuit function is to provide equal current pull-down on each input despite the input voltage levels. In this way it provides a very high differential impedance. It also provides more pulldown current at higher voltages levels, thereby providing a method of setting the common-mode of the circuit. In this way, delivering the switched currents into the load circuit adjusts the common-mode of the integration nodes jx 2108 and jxb 2109 until the load circuit removes exactly $(I_I+I_Q)/2-I_Y$ current from each side. Now it can be understood that when the I-switch is not providing any current to jx 2108 or jxb 2109, the load-circuit current will still be removing current, and make a falling-edge triangle waveform with equal slope. In both cases the waveform shape is thus then defined by $I_I-I_Y$ (switched)$-((I_I+I_Q)/2-I_Y)$. Similarly, the waveforms 2124,2125 of the 100% Q steering case can be seen to be completely defined by the timing of Q 2113.

The next interesting case to observe is when the steering control is somewhere between 100% I and 100% Q. This is demonstrated in FIG. 7 by jx,jxb waveforms 2122, 2123. In this case both I and Q switches are supplying some current to the integration, with I and Q timing respectively, forming a type of XOR-gate. During the 90° overlap when both I and Q are high, the current supplied is 100% of the total, resulting in a rising edge. However, when I and Q are of different values (i.e., 01 or 10) the current supplied is $(I_I+I_Q)/2-I_Y$, or exactly that which is removed by the load. This leads to a flat spot in the integration, where the jx and jxb waveforms neither rise nor fall. Finally, when both I and Q levels are 0, there is no current supplied and the load pulls $(I_I+I_Q)/2-I_Y$ out, providing a falling-edge. It should be noted that the switching action is differential, i.e., during the time when the switch provides up-current to jx 2108 it is not providing current to jxb 2109, thus resulting in the differential waveforms seen in FIG. 7.

It is worth observing the result of the different steering values on the integration crosspoints. By observing the movement of the jx/jxb crosspoint as the steering is transitioned from 100% I point in 2120,2121 through the 50% I/50% Q level in 2122,2123 to the 100% Q point in 2124,2125 it can be seen that a full quadrant (or 90°) of the phase-space has been crossed. It can be further seen that while the input clocks I and Q are shown as existing in quadrant I and II, the interpolation results in crosspoints that exist between quadrant II and III. This 90° phase-shift is easily accommodated when the interpolator is combined with phase selection logic that determines the correct polarity of the I and Q inputs to produce unlimited phase range. For any given selection of I and Q polarity, it can be seen that the interpolator provides a continuous transition point based on the input steering voltage across a single quadrant.

The use of phase-selection logic to determine I and Q input polarities is facilitated by PhaseMax 2106 and PhaseMin 2107 outputs. These inverters provide an indication of when the quadrant has been completely crossed and the output timing is either 100% I or 100% Q. This is done by inverters observing whether either $I_I$ or $I_Q$ is $<I_Y$. In this fashion, it can be reliably determined that there is no current provided to the jx/jxb waveforms from the I or Q switch, and thus that the weighting is 100% on the Q or I input clock respectively. A detailed description of each block now follows.

The V–>I conversion block 2001 provides the current steering input to the interpolator. An embodiment for this circuit is shown as FIG. 8. In order to provide maximum immunity from noise coupling onto ΔVin it is desirable to use as much ΔVin range as possible to traverse a quadrant. A pre-tilted compound differential pair has been designed which allows for easy tuning of the gain of the V–>I conversion as well as for a reduction of V–>I gain in order to allow for maximum ΔVin range. The circuit is pre-tilted by sizing transistor M3 2132 N-times larger than transistor M4 2133. Similarly, but complementarily, transistor M2 2134 is sized N-times larger than transistor M1 2131. In this fashion each of the differential pairs has been pre-tilted to one side. As both differential pairs are set to the same current by nbias 2130, it can be observed that they will have symmetric effects on the output. The results can be observed in FIG. 9. The net current $I_3$–$I_4$ 2202 clearly shows a shifted value of ΔVin required to steer its $\Delta I_{out}$. Similarly, the net current $I_1$–$I_2$ 2201 is shifted up from the zero-ΔVin point. However, when the two net currents are summed together to provide $I_L$–$I_R$ 2200, the input transition is now at ΔVin=0 and the ΔVin range required to steer the current from $-\Delta I_{out}$ to $+\Delta I_{out}$ has increased. The same number of transistors connected as an ordinary differential pair (nodes 2140 and 2141 would be connected together) would steer current with a reduced ΔVin. Thus the circuit of FIG. 8 has reduced gain compared to an ordinary differential pair containing the same transistors, but does not require additional headroom for the larger gate-source voltages that other reduced-gain solutions require. Additionally, as the separation of the two net currents, 2202 and 2201 in FIG. 9, is determined by the sizing factor N, the gain of this circuit can be easily adjusted. This is accomplished in this embodiment by using multiple transistor legs of the same size in the differential pairs and building the N-factor by determining the connection of their drain nodes. In different manufacturing processes N-factors of 3 to 7 have been used to accommodate different ΔVin ranges as well the different process gains.

A substantial improvement over the phase interpolator of U.S. Pat. No. 5,554,945 is in the combined use of nmos V–>I conversion and in PMOS current mirroring as shown in FIG. 10B. Many modem CMOS processes use a P-substrate wafer which is then counter-doped to produce different n-wells. However, frequently NMOS devices in these processes are left in the substrate or enclosed by a p-well which is electronically connected to the substrate. Also, frequently in these processes the bulk is not connected directly to a power supply, or can have a connection of high impedance. Thus, it is often possible for noise to occur on the bulk, or Vbb node. This noise will affect devices which may exist native in the well, such as the NMOS current source shown in 2210 of FIG. 10B. In prior art the current supplied to the load and switches of the interpolator was the net of a fixed PMOS/Vdd based current and an adjustable NMOS/Vss based current as can be seen in FIG. 10A. Unfortunately, when Vbb noise occurs in the topology, it not only directly affects the integration nodes, but it also does so as a function of the steering ratio. In this invention, while the inputs V+ 2100 and V– 2101 are maintained, the current is then mirrored through PMOS current-mirrors in current mirroring block 2002. While undergoing this mirroring, filter capacitors 2211 and 2212 are used to remove high-frequency current variations which may have been generated by Vbb-based noise effects on the V–>I conversion circuitry. Thus it can be seen that the current applied to the switches and load in this invention is much less sensitive to Vbb noise than that of prior art. A complementary version is obvious for complementary process technology.

Examples of the effectiveness of this technique can be seen by viewing the Vbb noise simulations of FIG. 11 (prior art) and FIG. 12 (this invention). In FIG. 11 a 10% step-down is applied to Vbb 2220 for ~2 ns, when the input pair is steered to 100% 1. As can be seen by observing the effect upon the differential current applied to the load 2221, a large drop occurs in the net current applied to the load. The same simulation applied to the circuit of this invention can be seen in FIG. 12. Here a substantial reduction in the ΔI noise induced by Vbb can be seen on 2222.

The Phase Max/Min detector block 2005 is needed in order for the interpolator to be used along with phase selector logic to generate unlimited phase range. The implementation of the detectors is shown as FIG. 13 and can be understood as follows. A small current $I_Y$ is removed from each branch of $I_I$ and $I_Q$ before the I and Q switches. If either $I_I$ or $I_Q$ are less than $I_Y$ then the nodes 2105 or 2104 will fall below the threshold of hysteresis inverters 2231 or 2230, asserting PhaseMax or PhaseMin. In this way, the Phase Max/Min detector block 2005 compares a small current to another small current and guarantees that PhaseMax 2106 and PhaseMin 2107 are only asserted when the value of I or Q current into the switches is in fact zero. In U.S. Pat. No. 5,554,945 a duplicate circuit (shown in FIG. 3) is used to generate signals Max 910 and Min 915. As this circuit is not actually measuring the real currents that enter the switches, but rather duplicating them in a matching circuit, multiple tuning is often required in order to get it to properly match. This invention directly measures and compares the I and Q currents against the $I_Y$ value and determines PhaseMax and PhaseMin from this comparison. Further illustration of the circuit operation is shown in FIG. 14. In this simulation, the individual current components of the V–>I conversion are shown in the second panel as 2201 and 2202, along with their sum and complement in the first panel as 2200 and 2203, respectively. The $I_Y$ current is also shown in the first panel as 2242, and the points at which the PhaseMax 2107/PhaseMin 2106 detectors should assert are simply the points at which currents 2200 and 2203 cross the $I_Y$ current 2242. In fact, this behavior can be observed in panel 3 which shows the assertion of PhaseMax 2107 where $I_Y>I_I$ and the assertion of PhaseMin 2106 where $I_Y>I_Q$. Hysteresis inverters 2230 and 2231 are simply inverting circuits with their switching threshold set below the normal operating point of 2104 and 2105, with some built in hysteresis. Hysteresis allows them to operate on slowly transitioning input waveforms without exhibiting multiple output transitions before settling.

One embodiment of current switch block 2003 is shown as FIG. 15. The block uses PMOS devices as differential pairs to switch the net currents coming from the Current Mirroring block 2002 and Phase Max/Min detectors block 2005. The operation of the current switch block shown is for Quadrant I. External phase selector logic can be used to selectively invert the polarity of the I, IB, Q and QB inputs in order to generate phases at any quadrant, resulting in an implementation with unlimited phase-range. It will be appreciated that IB is the complement of I, and QB is the complement of Q. I, IB, Q, and QB inputs may be also level-shifted in order to ensure that the PMOS switches remain in the saturation region of operation. Keeping these devices in saturation ensures that a current path will not exist directly between jx 2108 and jxb 2109 through the switches. This condition can exist if 2104 or 2105 is lower than ix 2108 or jxb 2109 respectively and I, IB, Q, or QB are low enough to activate the device in the reverse direction. As this would directly reduce the jx/jxb differential impedance it is avoided by raising the $V_{OL}$ of I, IB, Q and QB. Lastly, by selecting the switch polarity externally, this invention avoids consuming the headroom required by the two switches needed in the phase interpolator of U.S. Pat. No. 5,554,945 (see FIG. 4). In this prior art an XOR gate is built by stacking switches with quadrant-select inputs via devices 1110–1165. This arrangement requires more voltage down from the Vdd supply in order to correctly operate than this invention, where the XOR is essentially performed outside the interpolator.

In an alternate embodiment, the Current switches 2003 and Current Mirroring 2002 are merged into a single block, where the gates of the PMOS current sources are switched between Vdd and a steered $V_{OL}$ level which provides the correct current. This removes the headroom required for the series switch. This approach, however, generally requires more power and complexity in the merging of the switching current and steering current functions.

A block diagram of one embodiment of the Load Cell 2004 is shown as FIG. 16. The Load Cell has multiple requirements and its behavior has a strong effect on the quality of the final jx 2108/jxb 2109 integration waveforms. The first requirement is that of high differential impedance. This is required in order to maintain both large peak-to-peak swings and large dV/dt at the jx/jxb crosspoint. Each of these two metrics are critical for minimizing jitter. In addition, the Load Cell 2004 also sets the common mode voltage of the integration nodes jx 2108 and jxb 2109. This is important in order to maintain the Comparator 2006 operation in the highest gain*bandwidth region, but must not result in excessively high voltages that will diminish the saturation margin of the Current Switches 2003 or Current-mirror 2002 devices. Finally, the Load Cell 2004 must be able to tolerate short-term noise effects on jx 2108 and jxb 2109. In order to address these multiple requirements, the Load Cell is split into three different blocks, each connected to jx 2108 and jxb 2109. These three blocks, the Rdiff Load block 2008, the DC Commbn-mode block 2009 and the Transient Common-mode block 2010 will be individually discussed.

The function of the Rdiff Load block 2008 is to pull equal current out of both jx 2108 and jxb 2109 independent of their different voltages (i.e., form a high differential impedance) while also setting the common-mode. In this respect its design is similar to that of a current mirror/tail current source. However, it is critical that the Rdiff Load also not require excessive headroom to operate. Common configurations which provide very high differential impedance, such as current-source cascode configurations, require $2*V_t$ in order to properly operate. The load circuit used U.S. Pat. No. 5,554,945 can also be observed as devices 1170–1185 of FIG. 4. This load provides an infinite differential impedance in theory, but inadequate impedance in practice due to real device imperfections such as $G_{DS}$. An embodiment of the Rdiff load according to the present invention is shown in FIG. 17. Here the load devices are used in a stacked configuration with the top devices 2300, 2302, 2304, and 2306 operating in the saturation region and bottom devices 2301, 2303, 2305, and 2307 operating at the boundary between saturation and linear region, depending on the common-mode of jx/jxb. Whether the bottom devices are operating in linear or saturation mode they serve to increase the output resistance of the top devices. This configuration could be simply seen as an alternate way of representing a single layer of saturated devices with longer channel-lengths. However, in modern CMOS processes devices frequently exhibit a behavior where $V_t$ varies as a function of channel-length. Often the devices of the shortest channel-length have the lowest $V_t$. The design of the Rdiff-Load 2008 allows use of the shorter channel-length, lower $V_t$ devices, resulting in a lower turn-on (headroom) requirement then longer-channel length devices. An alternate embodiment for the Rdiff Load is shown as FIG. 18. In this configuration the bottom device gate connections are cross coupled to achieve some of the effects of a cascode-configuration without the same headroom requirements.

Results of the three different load configurations (the load circuit of FIG. 4, the preferred embodiment of FIG. 17, and the alternate embodiment of FIG. 18) are shown in FIG. 19 and FIG. 20. FIG. 19 shows the difference in current removed from jx 2108 and jxb 2109 when a fixed voltage equal to the expected jx/jxb swing is applied across them and the common-mode of jx/jxb is varied. As can be seen, the load in prior art has a very large $I_{diff}$ which becomes exponential in nature as the common mode is increased. The alternate embodiment 2850 has a much lower $I_{diff}$ with a strong linear characteristic. The preferred embodiment Rdiff load 2008 has a linear characteristic with lowest $I_{diff}$ and slightly higher turn-on voltages. For reference, a cascode load would require roughly twice the headroom of the prior art load to operate. As the load is to be used in a current/capacitance integrator, a second important metric is the load effect on differential capacitance (the difference of capacitance measured on jx 2108 and jxb 2109). The differential capacitance performance of the different loads can be observed in FIG. 20, where the same conditions as the $I_{diff}$ test are applied to the circuits. As can be clearly seen, the load of the prior art produces a substantial ΔC over a broad range of common-mode voltage. The alternate embodiment 2850 produces a slightly lower ΔC than that of the prior art, over a slightly smaller common-mode. The preferred embodiment Rdiff load 2008, however, produces the smallest ΔC, achieving roughly one third that of the prior art load. Thus, for reasons of both $I_{dif}$ and ΔC the Rdiff load of 2008 is an improvement over the prior art.

The function of the DC Common-mode block 2009 in FIG. 21 is to provide DC-common mode stabilization by sensing long-term common-mode levels on jx 2108 and jxb 2109 and stabilizing them to be substantially the same level. A circuit diagram of DC Common-mode block 2009 is shown as FIG. 21. The differential pair made up of current-source 2310 and diff-pair devices 2311 and 2312 form a comparator whose output is reversed-mirrored, and filtered to essentially DC levels by PMOS devices and capacitors 2313–2318. The mirrored and filtered current is pulled out of the side of opposite polarity, thus forming a circuit which attempts to equalize the common-mode value of jx 2108 and jxb 2109. The strength of this DC equalization is simply set by the value of current supplied by NMOS bias device 2310.

There are primarily two noise sources on jx 2108 and jxb 2109, short-term duty-cycle errors on I, IB, Q and QB, and the Vbb noise previously mentioned. Both of these noise sources serve to separate the common-mode voltages of jx 2108 and jxb 2109. This separation can be very destructive if not correctly countered, as shown in FIG. 23. In this figure, short-term duty-cycle noise is applied to an interpolator simulation in the form of +/−100 ps edge shifts in adjacent cycles. The result is jx/jxb common mode separation that can be seen in 2500. As the common-mode separation results in compression of phases, or an amplification of short-term duty-cycle error, the result can easily stress the gain*bandwidth of the Comparator 2006 as shown in 2502, and result in dropped output clock pulses if followed by a buffer chain attached to the output of Phase Comparator 2006 as seen in 2501.

The Transient Common-mode block 2010 shown in FIG. 22 maintains the high differential-impedance between jx and jxb needed for high-quality waveforms while stabilizing the common-mode under transient noise conditions. The operation of the circuit can be understood by first observing just the NMOS devices. NMOS diodes 2326 and 2327 constantly remove a small current set by current-source device 2321 from jx 2108 and jxb 2109. By doing this, however, they charge the capacitor 2322 on tank node 2331 to the voltage $V_{OH}$(jx,jxb)–$V_t$. When transient noise occurs which serves to push jx or jxb higher than their recent $V_{OH}$ levels, one of the diodes 2326 or 2327 will turn on, serving to clamp the high-going node to its recent $V_{OH}$. The PMOS side of the Transient Common-mode serves in a complementary fashion to clamp transient down-going transitions that are below the recent $V_{OL}$ level. The result of using the Transient common-mode circuit 2010 can be seen in FIG. 24 where the same stimulus applied in FIG. 23 are used, but this time with the Transient Common-mode circuit enabled. Transient common-mode separation is clamped as can be seen in 2550, duty cycle distortion in the comparator is minimized as can be seen in 2552, and there are no clock pulses dropped after buffering as can be seen in 2551. The Transient Common mode circuit 2010 thus serves to clamp transient common-mode separation caused by noise without adversely affecting the differential impedance of the interpolator integration.

The combined effects of these differences can be seen in a measured direct comparison of the phase interpolator of FIG. 4 and this invention in FIG. 25 and FIG. 26, respectively. FIG. 25 shows the integration nodes jx 2108 and jxb 2109 of prior art under two conditions. The top panel is under quiet conditions, i.e., with minimal Vbb, Vdd, and phase noise. The bottom panel is under noisy conditions where Vbb, Vdd and phase-noise occur. Even under quiet conditions, it is interesting to note that the prior art peak-to-peak swing 2600 is only approximately 300 mV. Under noisy conditions the peak to-peak swing 2601 is not degraded but the waveform characteristics at the crosspoint 2602 have been seriously effected. The differential dV/dT of the waveforms at the crosspoint is very low, resulting in large jitter out of a limited gain*bandwidth Comparator. The jx 2108 and jxb 2109 integration nodes from this invention under the same conditions are shown as FIG. 26. Under quiet and noisy conditions the peak-to-peak swing 2700 and 2701 are greatly improved, to approximately 600 mV. This is made possible by the greater headroom of this invention over prior art. Most significantly, the addition of noise in the second panel has very little effect on the quality of the waveform, especially during the critical crosspoint region 2702, where a large differential dV/dT is maintained.

One embodiment of Comparator block 2006 is implemented as a high-gain current-mode amplifier as shown in FIG. 27. Current steering and comparison is used in order to minimize the number of stages required for amplification. Full-swing outputs 2110 and 2111 are generated via current switched push-pull current source devices without having to drive small-swing signals into inverters, a source of jitter in prior art. As the Comparator inputs load the integration nodes of the interpolator, it is important that they not add significant capacitance. Too much input capacitance would affect the dV/dt and swing of the jx/jxb integration nodes. The design of FIG. 27 provides very high gain*bandwidth, good noise immunity and minimum input capacitance to achieve this.

A final measured comparison to the phase interpolator of U.S. Pat. No. 5,554,945 can be seen in both FIG. 28 and FIG. 29. Here the measured final interpolator output waveforms are shown with the jitter of each implementation measured under noisy operating conditions. The peak-to-peak jitter of U.S. Pat. No. 5,554,945 can be seen to be 280 ps, whereas the peak-to-peak jitter of this invention can be seen to be 180 ps, a 36% improvement. This invention thus achieves substantially better performance while maintaining the same input and output signalling.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method of operation in a phase interpolator circuit, the method comprising:

generating a first current in relation to a control voltage using a current switch;

generating a second current in relation to the first current using a first current mirror circuit;

selectively steering the second current to a first selected node of first and second nodes to generate a first voltage transition at the first selected node, the second current being steered to the first node when a first input signal is in a first state and the second current being steered to the second node when the first input signal is in a second state;

generating a third current in relation to a second control voltage, wherein the second control voltage is complementary to the first control voltage;

generating a fourth current in relation to the third current using a second current mirror circuit; and, selectively steering the fourth current to a second selected node of the first and second nodes to generate a second voltage transition at the second selected node, the fourth current being steered to the first node when a second input signal is in the first state and the fourth current being steered to the second node when the second input signal is in the second state, wherein the second input signal is phase offset from the first input signal by a first phase angle.

2. The method of claim 1 further comprising:

sinking a portion of the second current from one of the first and second nodes in a first load circuit to generate a second voltage transition at the one of the first and second nodes.

3. The method of claim 1 further comprising:

amplifying voltages present at the first and second nodes to generate an output signal.

4. The method of claim 3 wherein the first phase angle is a quadrature phase angle.

5. The method of claims 1 further comprising:
sinking a portion of the first current to a ground potential terminal using a current source coupled to the first current mirror circuit.

6. The method of claim 1, further comprising:
removing an amount of current from the second current to produce a fifth current; and
detecting when the fifth current exceeds a threshold to generate a control signal.

7. The method of claim 6 further comprising:
selecting the first input signal from a plurality of input signals in response to the control signal.

8. The method of claim 7 wherein the plurality of input signals includes quadrature phase dock signals.

9. The method of claim 1 further comprising:
limiting a slew rate of a bias voltage in the first current mirror circuit using a capacitor coupled to the first current mirror circuit.

10. The method of claim 1 further comprising:
sensing common mode levels on the first and second nodes; and
reducing a difference between common mode levels of the first and second nodes to stabilize the common mode levels on the first and second nodes.

11. The method of claim 10 wherein the difference is reduced to a level that is set by a biased current source.

12. The method of claim 1 further comprising:
clamping common mode transients using a first diode element coupled between the first node and a capacitor electrode, and a second diode element coupled between the second node and the capacitor electrode, such that the transients are clamped using a charge stored on the capacitor electrode.

13. A phase interpolator circuit comprising:
a first current supply generating a first current in relation to a first control voltage;
a first current mirror circuit generating a second current related to the first current;
a first current steering switch steering the second current to a first selected node of first and second nodes to generate a first voltage transition at the first selected node, the second current being steered to the first node when a first input signal is in a first state and the second current being steered to the second node when the first input signal is in a second state;
a second current supply generating a third current in relation to a second control voltage;
a second current mirror circuit generating a fourth current related to the third current, wherein the fourth current is complementary to the second current; and,
a second current steering switch steering the fourth current to a second selected node of the first and second nodes in response to a second input signal.

14. The phase interpolator of claim 13 further comprising:
a first load circuit sinking a portion of the second current from the first selected node.

15. The phase interpolator of claim 13 wherein a rising voltage transition is generated at one of the first and second nodes, and a falling voltage transition is generated at the other one of the first and second nodes.

16. The phase interpolator circuit of claim 13 further comprising:
an amplifier generating an output signal in response to voltage levels at the first and second nodes.

17. The phase interpolator of claim 16 wherein the second input signal has a first phase offset with respect to the first input signal.

18. The phase interpolator of claim 16 further comprising:
second load circuit sinking a portion of the fourth current from the second selected node.

19. The phase interpolator of claim 13 wherein the first current supply comprises first and second transistors having a common drain node and a common gate node, the first transistor being source coupled to a first bias source and the second transistor being source coupled to a second bias source.

20. The phase interpolator of claim 19 wherein the first transistor has a larger gate length than the second transistor.

21. The phase interpolator of claim 13 further comprising:
a capacitor coupled between a bias node of the first current mirror and a supply terminal.

22. The phase interpolator of claim 13 further comprising:
circuitry reducing the first current to produce a resultant current;
detector circuitry generating a control signal indicative of when the resultant current exceeds a threshold;
wherein the control signal is used to select the first input signal from a plurality of input signals.

23. The phase interpolator of claim 22 wherein the plurality of input signals comprises quadrature phase related signals.

24. The phase interpolator of claim 22 wherein the circuitry reducing the first current comprises a transistor coupling a supply terminal to the first current.

25. The phase interpolator of claim 13 further comprising:
first and second transistors having a common source node coupled to a current source, the first transistor having a gate coupled to the first node, and the second transistor having a gate coupled to the second node;
a second current mirror circuit to mirror an amount of current from the first node to a current at the drain of the second transistor; and
a third current mirror circuit to mirror an amount of current from the second node to a current at the drain of the first transistor.

26. The phase interpolator of claim 25 further comprising:
a first capacitor to limit a slew rate of a voltage at the drain of the first transistor; and
a second capacitor to limit a slew rate of a voltage at the drain of the second transistor.

27. The phase interpolator of claim 13 further comprising:
a first current source coupled to a first capacitor electrode;
a first diode element coupled between the first node and the first capacitor electrode; and
a second diode element coupled between the second node and the first capacitor electrode.

28. The phase interpolator of claim 27 further comprising:
a second current source coupled to a second capacitor electrode;
a third diode element coupled between the first node and the second capacitor electrode; and
a fourth diode element coupled between the second node and the second capacitor electrode.

29. The phase interpolator of claim 28 wherein:
the first capacitor electrode is included on a first capacitor, and another electrode of the first capacitor is coupled to a first supply node; and
the second capacitor electrode is included on a second capacitor, and another electrode of the second capacitor is coupled to a second supply node.

30. A phase interpolater comprising:
a first current supply generating a first current in relation to a first control voltage;
a first current mirror circuit generating a second current related to the first current;
a first current steering switch steering the second current to a first selected node of first and second nodes to generate a first voltage transition at the first selected node, the second current being steered to the first node when a first input signal is in a first state and the second current being steered to the second node when the first input signal is in a second state;
a second current supply generating a third current in relation to a second control voltage that is complementary to the first control voltage, the second current supply comprising:
   first and second transistors having a common drain node and a common gate node, the first transistor being source coupled to a first bias source and the second transistor being source coupled to a second bias source, wherein the second transistor has a larger gate length than the first transistor.

31. A phase interpolator circuit comprising:
an adjustable current supply circuit generating differential currents in relation to differential control voltages;
a first current mirror circuit generating a first current related to the differential currents;
at least one current steering switch generating a voltage transition at one of first and second nodes in response to a first input signal, wherein the first current is steered to the first node when the first input signal is in a first state and the first current is steered to the second node when the first input signal is in a second state; and
a comparator circuit generating an output signal in relation to the first and second nodes.

32. The phase interpolator circuit of claim 31 further comprising:
a second current source generating a second current related to the differential currents; and
a first load circuit sinking a portion of the second current from one of the first and second nodes, wherein the sunk portion of the second current is sunk from the second node when the first input signal is in the first state, and the sunk portion of the second current is sunk from the first node when the first input signal is in the second state.

33. The phase interpolator circuit of claim 31 wherein the adjustable current supply circuit comprises:
a first differential amplifier including:
   a current source;
   a first transistor having a gate, a source and a drain, the gate receiving a first control voltage of the differential control voltages, and the source being coupled to the current source; and
   a second transistor having a gate, a source and drain, the gate receiving a second control voltage of the differential control voltages, and the source being coupled to the current source; and
a second differential amplifier including:
   a current source;
   a first transistor having a gate, a source and a drain, the gate receiving the first control voltage, the source being coupled to the current source, and the drain being coupled to the drain of the first transistor of the first differential amplifier; and
   a second transistor having a gate, a source and drain, the gate receiving the second control voltage, and the source being coupled to the current source, and the drain being coupled to the drain of the second transistor of the first differential amplifier.

34. The phase interpolator circuit of claim 33 wherein:
the first transistor of the first differential amplifier includes a gate length that is greater than a gate length of the second transistor of the first differential amplifier; and
the second transistor of the second differential amplifier includes a gate length that is greater than a gate length of the first transistor of the second differential amplifier.

35. The phase interpolator of claim circuit of claim 31 further comprising:
a capacitor having a first electrode coupled to a supply terminal;
a first current source coupled to a second electrode of the capacitor;
a first diode element coupled between the first node and the second electrode; and
a second diode element coupled between the second node and the second electrode.

36. The phase interpolator of claim 31 further comprising:
first and second transistors having a common source node coupled to a current source, the first transistor having a gate coupled to the first node, and the second transistor having a gate coupled to the second node;
a second current mirror circuit to mirror an amount of current from the first node to a current at a drain of the second transistor; and
a third current mirror to mirror an amount of current from the second node to a current at a drain of the second transistor.

37. A method of operation in a phase interpolator circuit, the method comprising:
generating a first current in relation to a control voltage using a current switch;
generating a second current in relation to the first current using a first current mirror circuit;
selectively steering the second current to a first selected node of first and second nodes to generate a first voltage transition at the first selected node, the second current being steered to the first node when a first input signal is in a first state and the second current being steered to the second node when the first input signal is in a second state;
reducing the second current to produce a third current;
generating a control signal when the third current reaches a threshold.

38. The method of claim 37 further comprising:
selecting the first input signal from a plurality of input signals in response to the control signal.

39. The method of claim 38 wherein the plurality of input signals includes quadrature phase clock signals.

40. A method of operation in a phase interpolator circuit, the method comprising:
generating a first current in relation to a control voltage using a current switch;
generating a second current in relation to the first current using a first current mirror circuit;
selectively steering the second current to a first selected node of first and second nodes to generate a first voltage transition at the first selected node, the second current being steered to the first node when a first input signal is in a first state and the second current being steered to the second node when the first input signal is in a second state;

detecting common mode levels on the first and second nodes; and, reducing any detected difference between common mode levels on the first and second nodes.

41. A phase interpolator circuit comprising:

a first current supply generating a first current in relation to a first control voltage;

a first current mirror circuit generating a second current related to the first current;

a first current steering switch steering the second current to a first selected node of first and second nodes to generate a first voltage transition at the first selected node, the second current being steered to the first node when a first input signal is in a first state and the second current being steered to the second node when the first input signal is in a second state;

circuitry reducing the first current to produce a resultant current;

detector circuitry generating a control signal indicative of when the resultant current exceeds a threshold;

wherein the control signal is used to select the first input signal from a plurality of input signals.

42. The phase interpolator of claim 41 wherein the plurality of input signals comprises quadrature phase related signals.

* * * * *